United States Patent [19]

Ley

[11] Patent Number: 4,500,973
[45] Date of Patent: Feb. 19, 1985

[54] ELECTRONIC DEVICES

[75] Inventor: Anthony J. Ley, Los Altos Hills, Calif. 94022

[73] Assignee: Enertec, Montrouge, France

[21] Appl. No.: 425,737

[22] Filed: Sep. 28, 1982

Related U.S. Application Data

[62] Division of Ser. No. 905,450, May 12, 1978, Pat. No. 4,359,684.

[30] Foreign Application Priority Data

May 16, 1977 [GB] United Kingdom ............... 20564/77

[51] Int. Cl.³ ..................... G06J 1/00; G06G 7/16
[52] U.S. Cl. .................... 364/606; 307/529; 328/160; 364/483; 364/605; 364/841; 324/142
[58] Field of Search ............... 364/605, 606, 841, 483; 328/127, 160; 324/141, 142, 127, 96; 307/490, 498, 521, 455, 467, 500, 313, 529

[56] References Cited

U.S. PATENT DOCUMENTS

| | | | |
|---|---|---|---|
| 3,002,690 | 10/1961 | Meyer | 364/819 |
| 3,432,650 | 3/1969 | Thompson | 328/160 X |
| 3,440,441 | 4/1969 | Ley | 328/160 X |
| 3,648,182 | 3/1972 | Carnel | 328/160 |
| 3,764,908 | 10/1973 | Elms | 324/142 |
| 3,780,273 | 12/1973 | Turrell | 364/606 |
| 3,867,620 | 2/1975 | Coor | 328/160 X |
| 3,955,138 | 5/1976 | Milkovic | 324/142 X |
| 4,056,774 | 11/1977 | Shum | 324/142 |
| 4,079,313 | 3/1978 | Callan | 324/142 |
| 4,138,649 | 2/1979 | Schaffer | 330/9 |

FOREIGN PATENT DOCUMENTS 425890 6/1967 Switzerland .

Primary Examiner—Joseph F. Ruggiero
Attorney, Agent, or Firm—D. Gaudier

[57] ABSTRACT

An electronic watthour meter for connection in a two-wire power distribution circuit comprises a shunt connected in one of the wires and an electronic circuit comprising a transconductance multiplier, a V to F converter and a reversible counter. The DC power supply of the electronic circuit is referred to the wire containing the shunt, which wire is always live, so that the electronic circuit "floats" electrically on this live wire. The first input of the multiplier can therefore be directly connected across the shunt, and the second input is connected via a high value resistance to the other wire so as to receive an input current representative of the voltage between the wires. To eliminate the effects of drift in the multiplier, the polarity of the input current to the multiplier and the direction of counting of the counter are periodically and simultaneously reversed by a square wave signal of 1:1 mark space ratio. The electronic circuit is implemented using LSI techniques.

19 Claims, 13 Drawing Figures

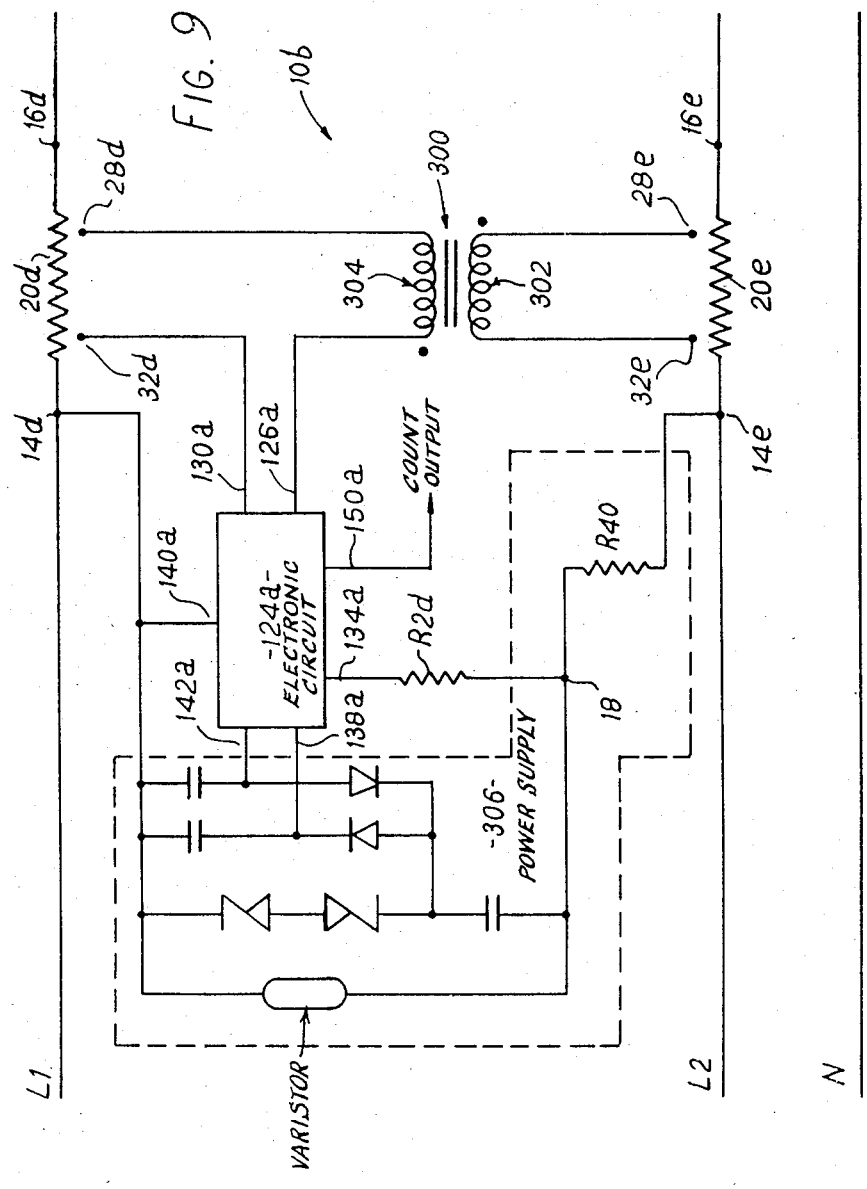

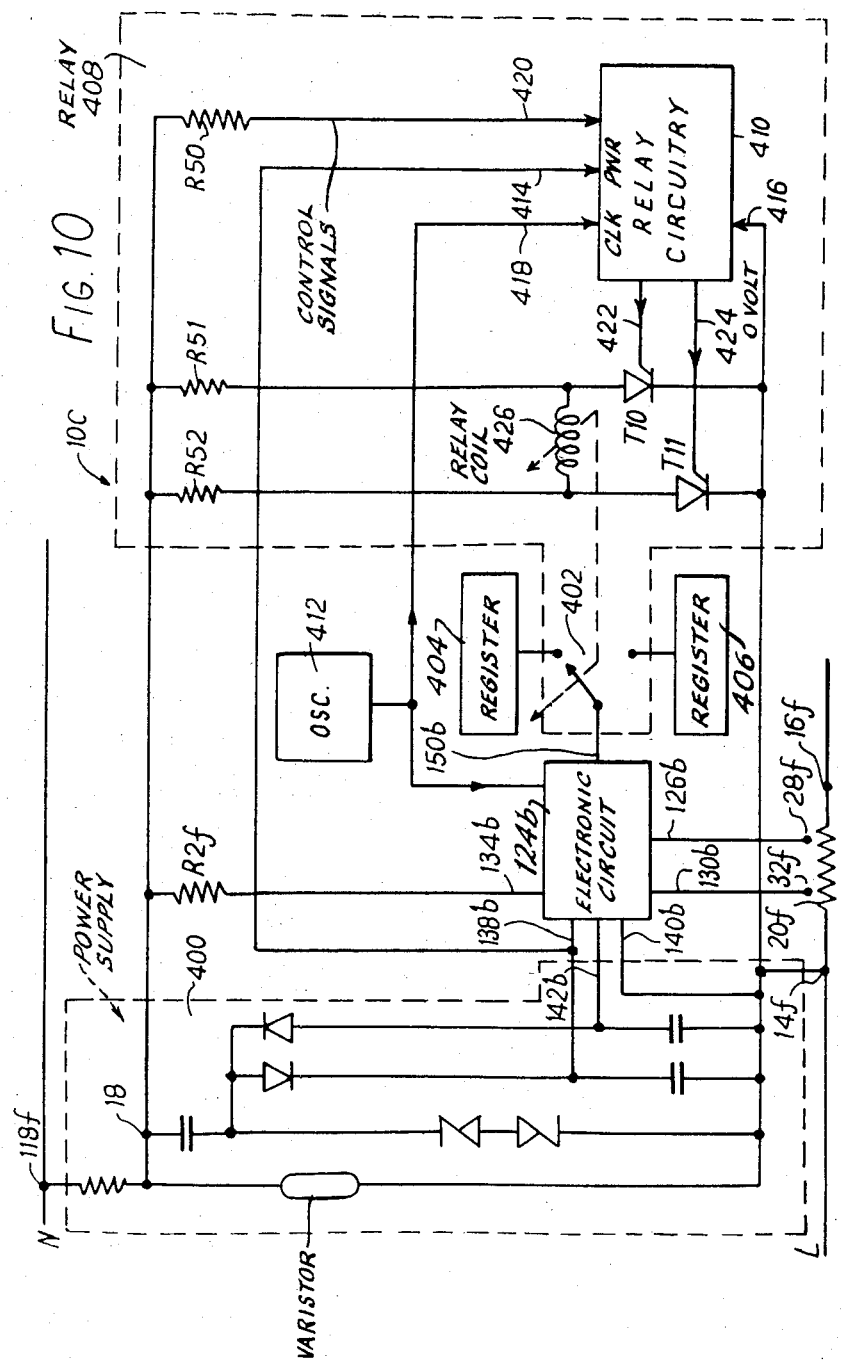

ELECTRONIC DEVICES

This is a division of application Ser. No. 905,450 filed May 12, 1978, now U.S. Pat. No. 4,359,684 issued Nov. 16, 1982.

This invention relates to electronic devices adapted to be connected in electrical power distribution circuits for producing an output signal related to the power supplied by an electrical power supplier to an electrical power consumer via the distribution circuit, and is more particularly but not exclusively concerned with such devices for use in watthour meters in domestic, i.e. non-industrial electrical power distribution circuits.

A typical domestic electrical power distribution circuit comprises two or more wires, one of which may be regarded as a reference wire, the voltage between the or each other wire and the reference wire typically being at least 100 volts AC. Frequently, but not necessarily, the reference wire is either connected directly to earth or has its voltage with respect to earth maintained at a predetermined low value, typically ±5 or ±10 volts: in such a case, the reference wire is usually referred to as the neutral wire, and the other wire or wires are usually referred to as the live wire or wires. However, regardless of whether or not the voltage of the reference wire with respect to earth is maintained equal or close to zero, the voltage of the or each other wire with respect to earth is typically at least 100-volts AC.

There have been several prior art proposals for electronic watthour meters for connection in such domestic electrical power distribution circuits, to measure the amount of electrical energy supplied to a domestic consumer. Considering first the simple case of a two-wire distribution circuit, in most of these prior art proposals the voltage between the reference wire and the other wire and the current flowing in the other wire are both sensed by suitable sensing means, and the product of the sensed current and the sensed voltage is formed and integrated with respect to time in an electronic circuit which includes a multiplier.

A common problem encountered with prior art electronic watthour meters is that caused by drift and offset signals, hereinafter referred to collectively as drift, in the electronic circuit, particularly in the multiplier, since it is important that this drift should neither affect the accuracy of the indications produced by the meter nor cause the indications to change when no power is being supplied via the wires to which the meter is connected. This problem is of increased significance if it is desired to use a multiplier of the variable-transconductance type, since this type of multiplier is particularly susceptible to drift. Thus although variable transconductance multipliers are paticularly suitable for implementation as integrated circuits by conventional large scale integration techniques, they have not in the past been thought suitable for use in electronic watthour meters because of this drift problem.

It is therefore an object of the present invention to provide an electronic circuit suitable for use in an electronic watthour meter, in which circuit the aforementioned drift problem is substantially alleviated.

According to the present invention, there is provided an electronic circuit for producing an output signal representative of the time integral of the product of two input signals, the circuit comprising:

a multiplier, preferably a variable-transconductance multiplier, for receiving and multiplying together the two input signals to produce a signal dependent upon the product of the two input signals;

a converter circuit arranged to convert the product-dependent signal to a digital signal representative of the magnitude of the product-dependent signal; and means for accumulating said digital signals so as to produce said output signal;

further comprising means for repetitively and simultaneously reversing the effective polarity of one of the input signals and the polarity with which said digital signals are accumulated so as to substantially reduce errors in said output signal due to drift in the multiplier.

The invention will now be described, by way of example only, with reference to the accompanying drawings, of which:

FIG. 9 is a simplified circuit diagram of part of the circuitry of an electronic watthour meter in accordance with the present invention, for use in a three-wire two-phase electrical power distribution circuit; and FIG. 10 is a simplified circuit diagram of an electronic watthour meter in accordance with the present invention, incorporating a remotely controllable relay.

Figure 1:
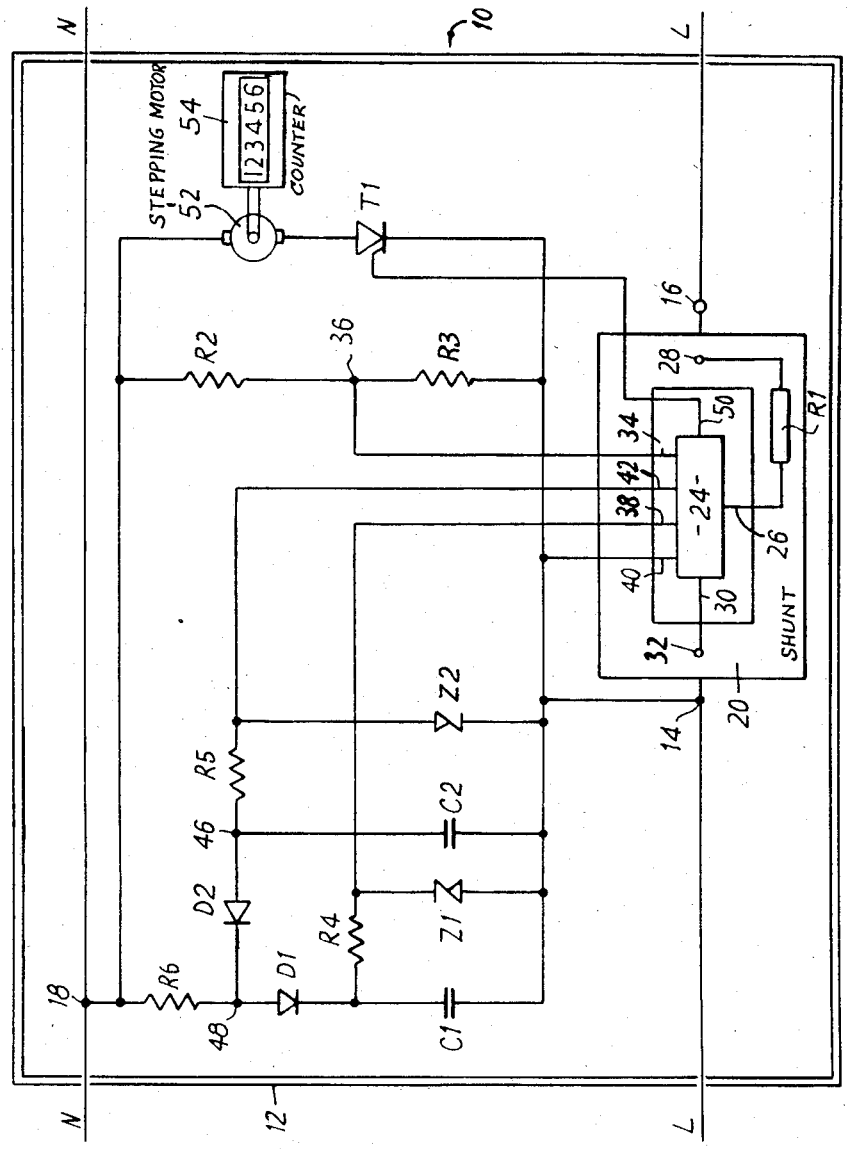
FIG. 1 is a diagrammatic representation of an electronic watthour meter in accordance with the present invention, for connection in a two-wire electrical power distribution circuit.

The electronic watthour meter illustrated in FIG. 1 is indicated generally at 10, and is shown connected in a domestic electrical power distribution circuit consisting of a live wire L, which may typically have a voltage of at least 100 volts AC with respect to earth, and a neutral or reference wire N, whose voltage with respect to earth is typically (but not necessarily) maintained at less than ±10 volts by the electrical power supplier. The electrical power supplier's power generation installation will be assumed to be connected to the left hand ends of the wires L and N, as viewed in FIG. 1, while the electrical power consumer's installation will be assumed to be connected to the right hand ends of the wires L and N.

The meter 10 comprises a housing 12 made from an electrically insulating material, e.g. a suitable plastics material, the housing 12 containing a pair of terminals 14,16 which are series connected in the live wire L and a third terminal 18 which is connected to the neutral wire N. A metallic current shunt 20 is series connected between the terminals 14 and 16, so that all the current flowing in the live wire L passes through this shunt. The shunt 20 is substantially rectangular in shape and contains a substantially rectangular central opening in which is mounted an electronic circuit 24. The circuit 24 is implemented as a single integrated circuit device on a common substrate by known large scale integration (LSI) techniques, and constitutes the majority of the components of an electronic multiplier, a voltage-to-frequency converter and a reversible counter as will be described in more detail hereinafter. For simplicity, those components of the circuit 24 which are not integrated (e.g. capacitors) are not illustrated in FIG. 1.

The circuit 24 has a first input 26 connected, via a temperature compensation resistor R1 mounted in intimate thermal contact with the shunt 20, to a point 28 near the end of the shunt 20 connected to the terminal 16, and a second input 30 connected to a point 32 near the other end of the shunt (i.e. the end connected to the terminal 16). The position of the points 28,32 is selected such that the resistance of the portion of the shunt 20 between them has a value which will result in the generation of a known voltage, typically about 5 millivolts, when a known current, typically 20 amps, is flowing in the live wire L.

The circuit 24 also has a third input 34 connected to the junction 36 between two resistors R2 and R3, which are series connected between the terminals 18 and 14 to form a potential divider. The resistor R2 connected to the terminal 18 typically has at least 100 times the value of the resistor R3, so that the voltage generated between the junction 36 and the terminal 14 is at most a few volts AC, and typically about one volt AC.

Additionally, the circuit 24 has positive, zero and negative power supply inputs 38,40 and 42, the input 40 being connected to the terminal 14. The inputs 38 and 42 are connected to the terminal 14 by respective oppositely directed zener diodes Z1, Z2, and via respective resistors R4 and R5 to respective circuit points 44,46. The circuit points 44,46 are connected via respective smoothing capacitors C1 and C2 to the terminal 14, and via respective oppositely directed diodes D1 and D2 to a common point 48. A further resistor R6 connects the common point 48 to the terminal 18.

Finally, the circuit 24 has an output 50 connected to the control input or gate of a thyristor T1, which is connected in series with a stepping motor 52 between the terminals 18 and 14. The stepping motor 52 is drivingly connected via step-down gearing (not shown) of suitable ratio, to a conventional totalising counter 54, of the kind comprising a plurality of coaxial indicator wheels: these wheels are geared together, and each bears around its periphery the digits 0 to 9, an indicated number composed of a respective digit of each wheel being visible from outside the housing 12 through a window (not shown) provided in the housing.

Figure 2:
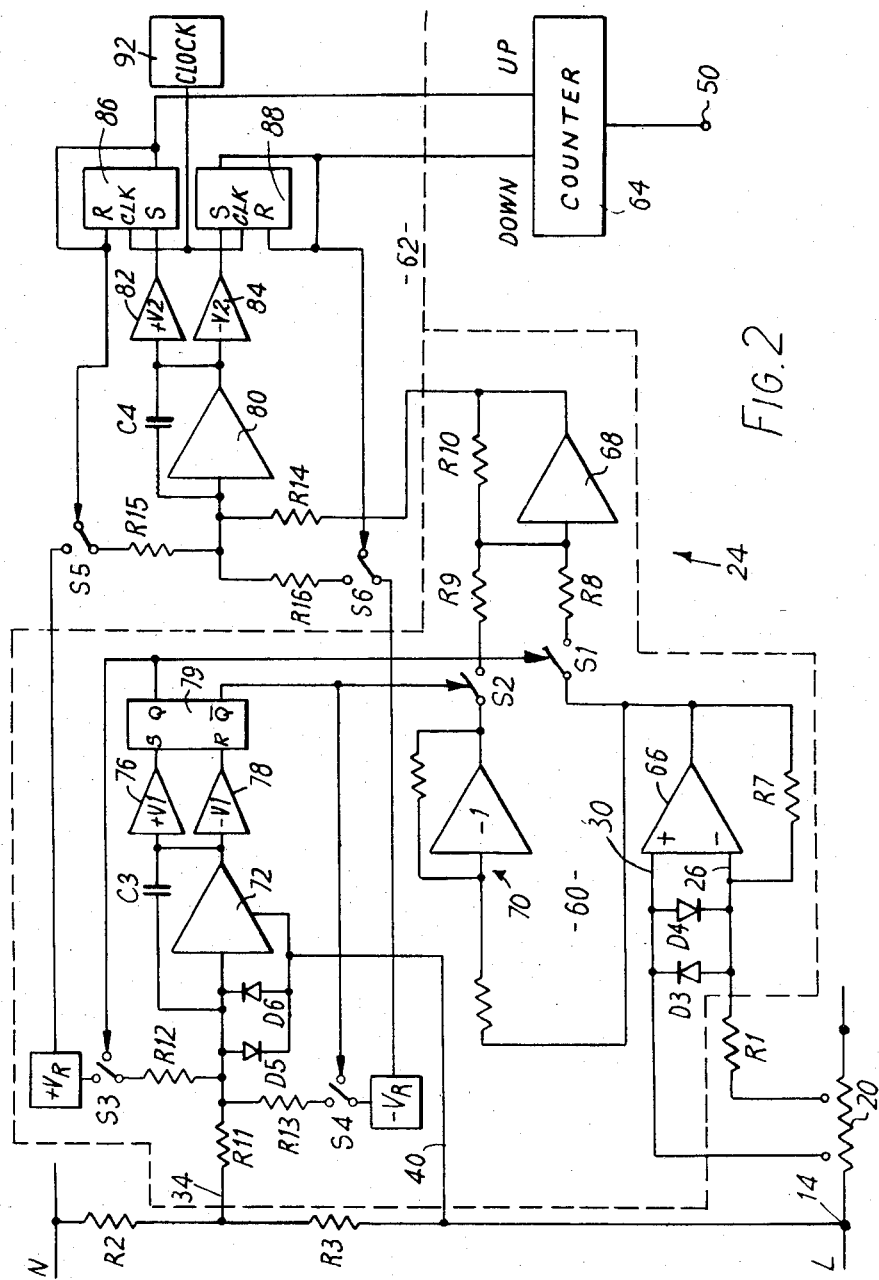
FIG. 2 is a simplified circuit diagram of the electronic circuitry of the meter of FIG. 1.

Turning now to FIG. 2, which is a circuit diagram of the circuit 24, the aforementioned multiplier, voltage-to-frequency converter and reversible counter of the circuit 24 are indicated generally at 60, 62 and 64 respectively.

The multiplier 60 includes a differential amplifier 66 whose non-inverting and inverting inputs constitute the inputs 26 and 30 respectively of the circuit 24. A pair of oppositely directed diodes D3, D4 are connected in parallel between the inputs 26, 30, and a resistor R7 is negative-feedback connected between the output of the amplifier 66 and the input 26. The output of the amplifier 66 is connected via the series cmbination of a first semiconductor switching device S1 and a summing resistor R8 to the summing point of a summing amplifier 68, and via the series combination of a unity gain inverting amplifier 70, a second semiconductor switching device S2 and a summing resistor R9 to the summing point of the amplifier 68. The resistors R8 and R9 are equal in value. A resistor R10 is negative-feedback connected between the output and the summing point of the amplifier 68, the output of the amplifier 68 constituting the output of the multiplier 60.

The multiplier 60 also includes a high gain inverting amplifier 72, whose input is connected to the third input 34 of the circuit 24 via a resistor R11. The input of the amplifier 72 is also connected via the series combination of a resistor R12 and a semiconductor switch S3 to a positive reference voltage source $+V_R$ and via the series combination of a resistor R13 and a semiconductor switch S4 to a negative reference voltage source $-V_R$. The reference voltage sources can be implemented in any convenient way, for example as described in U.S. Pat. No. 3,976,896 and the reference voltages they produce are equal in magnitude, as are the values of the resistors R12 and R13. Two oppositely directed diodes D5 and D6 are connected in parallel between the input of the amplifier 72 and the zero power supply input 40. Additionally, a capacitor C3 is negative-feedback connected between the output and the input of the amplifier 72, which thus operates as an integrator.

The output of the amplifier 72 is connected to the respective inputs of two voltage level detectors 76 and 78, having voltage thresholds $+V1$ and $-V1$ which are equal in magnitude but opposite in polarity. The respective outputs of the detectors 76, 78 are connected to the set and reset inputs of a bistable circuit 79, whose set output controls the switches S1 and S3 and whose reset output controls the switches S2 and S4.

The voltage-to-frequency converter 62 comprises a high gain inverting amplifier 80 whose input is connected to the output of the multiplier 60 (i.e. to the output of the amplifier 68) via a resistor R14. The input of the amplifier 80 is connected to the voltage source $+V_R$ via the series combination of a resistor R15 and a semiconductor switch S5, and to the voltage source $-V_R$ via the series combination of a resistor R16 and a semiconductor switch S6. A capacitor C4 is negative-feedback connected between the output and the input of the amplifier 80, which thus also operates as an integrator.

The output of the amplifier 80 is connected to the respective inputs of positive and negative voltage level detectors 82,84 substantially identical to the detectors 76 and 78. The respective outputs of the detectors 82,84 are connected to the respective set inputs of two bistable circuits 86,88, each of which has a clock input connected to the output of a clock pulse generator 92 (e.g. a crystal-controlled oscillator) and also has its set output coupled to its reset input. The respective set outputs of the bistable circuits 86,88 are connected to control the switches S5 and S6 respectively, and together constitute the output of the voltage-to-frequency converter 62.

The respective set outputs of the bistable circuits 86,88 are connected to the up-count and down-count inputs respectively of the reversible counter 64, which has an overflow output which constitutes the output 50 of the circuit 24.

In operation, and referring initially to FIG. 2, the potential divider constituted by the resistors R2,R3 produces at its junction 34 a voltage $V_x$ whose instantaneous magnitude is proportional to the instantaneous magnitude of the voltage V between the wires L and N, and this voltage $V_x$ is applied to the multiplier 60. Within the multiplier 60, the voltage $V_x$ is applied to and integrated by the integrator based upon the amplifier 72. The combination of this integrator with the detectors 76 and 78, the bistable circuit 79, the switches S3 and S4, and the reference voltage sources $+V_R$ and $-V_R$ operates as an oscillator, which, when the voltage $V_x$ is zero, produces at the set and reset outputs of the bistable circuit 79 respective square waves of 1:1 mark-space ratio. The reference voltages of the sources $+V_R$ and $-V_R$ are chosen to be greater than the greatest normally expected magnitude of the voltage $V_x$, and the time constant of the integrator is selected so that the frequency of the square waves is much greater than the frequency of the voltage $V_x$ (which is of course at the normal line frequency of 50 Hz or 60 Hz): typically the square waves may have a frequency of about 10 KHz. Thus when the voltage $V_x$ is positive, the switch S4 must close for longer than the switch S3 to maintain equilibrium, while when the voltage $V_x$ is negative, the switch S3 must close for longer than the switch S4 to maintain equilibrium, i.e. the respective mark-space ratios of the two square wave signals change in opposite directions in dependence upon the magnitude and polarity of the voltage $V_x$. Mathematically, $$V_x T + V_R(T-t) - V_R t = 0 \quad (1)$$

where T is the period of the square waves and t is the time for which the switch S4 is closed during the period T. Re-arranging equation (1) gives:

$$t/T = (V_R + V_x)/2V_R \quad (2)$$

and $$1 - t/T = (V_R - V_x)/2V_R \quad (3)$$

The current shunt 20 produces between the points 28 and 32 thereof a voltage $V_y$ whose instantaneous magnitude is proportional to the instantaneous magnitude of the current I flowing in the wire L. This voltage $V_y$ is also applied to the multiplier 60, within which it is inverted and amplified by the amplifier 66. The inverted and amplified voltage produced by the amplifier 66 is effectively multiplied by $1-t/T$ by the switch S1, and is inverted again and effectively multiplied by $t/T$ by the switch S2, the voltages resulting from these multiplications being summed with inversion by the summing amplifier 68. The output voltage $V_z$ produced by the amplifier 68 is therefore proportional to $$V_y(V_R - V_x)/2V_R - V_y(V_R + V_x)/2V_R \quad (4)$$

which simplifies to $$-(V_x V_y / V_R) \quad (5)$$

Thus the output voltage $V_z$, which is also the output of the multiplier 60, is proportional to V.I, the product of the voltage between the wires L and N and the current flowing in the wire L. It will be appreciated that the multiplier 60 operates as a four-quadrant multiplier.

The voltage $V_z$ is applied to the voltage-to-frequency converter 62, within which it is integrated by the integrator based upon the amplifier 80. If the voltage $V_z$ is negative (indicating that the product V.I is positive), the output of the amplifier 80 ramps positively at a rate dependent upon the magnitude of the output voltage, and triggers the detector 82. The immediately succeeding clock pulse from the generator 92 sets the bistable circuit 86, thus closing the switch S5 to connect the positive reference voltage source $+V_R$ to the integrator. The next succeeding clock pulse resets the bistable circuit 86, so that the source $+V_R$ is in fact connected to the integrator for exactly one period of the clock pulses produced by the generator 90. The precisely defined amount of charge thus supplied to the integrator in this period is arranged to be sufficient to cause the output of the integrator to ramp back below the detection level of the detector 82. The sequence of events just described is then repeated, at a frequency proportional to the magnitude of the voltage $V_z$. If the voltage $V_z$ is positive, which can occur for portions of each cycle of the voltage V when there is a 90° phase difference between the voltage V and the current I, a sequence of events exactly analogous to that described for negative values of $V_z$ takes place repeatedly, but this time under the influence of the detector 84, the bistable circuit 88 and the negative reference voltage source $-V_R$.

Thus the bistable circuit 86 produces at its set output a first pulse train whose pulse rate is proportional to magnitude of the product V.I when this product is positive, while the bistable circuit 88 produces at its set output a second pulse train whose pulse rate is proportional to the product V.I when this product is negative. The normal maximum value of these pulse rates is arranged to be about 10 KHz.

The first and second pulse trains are applied to the up-count and down-count inputs respectively of the reversible counter 64, where they are effectively integrated with respect to time. Each time the counter 64 counts up to a predetermined count, typically of the order $10^4$, it produces at its overflow output an overflow pulse which is applied to the thyristor T1 of FIG. 1. The duration of the overflow pulse is arranged to be between one period and half a period of the voltage V, to ensure that the thyristor is rendered conductive and thus causes the stepping motor 52 to turn by a single angular step. The stepping motor 52 drives the indicator wheels of the counter 54, via the aforementioned step-down gearing, so that the counter S4 effectively continues the integration with respect to time commenced in the counter 64 and thus indicates the total amount of electrical energy supplied via the wires L and N to the consumer.

It will be appreciated that the multiplier 60, the voltage-to-frequency converter 62 and the counter 64 of FIG. 2 derive the DC power supply voltages required for their operation from the inputs 38, 40 and 42 of the circuit 24; the precise details of the connections of most of the individual elements of the multiplier 60, the converter 62 and the counter 64 to the inputs 38, 40 and 42 are not shown in FIG. 2 for the sake of simplicity, but some such connections are shown by way of example. The respective supply voltages at the inputs 38, 40 and 42 are generated from the voltage V between the wires L and N, as can be seen in FIG. 1, by the power supply circuit constituted by the resistor R6, the diodes D1 and D2, the smoothing capacitors C1 and C2, the resistors R4 and R5, and the voltage stabilising zener diodes Z1 and Z2, and are typically about +5 volts, 0 volts and −5 volts with respect to the terminal 14 (and therefore with respect to the wire L).

Thus the circuit 24 is directly connected to and "floats" electrically on the wire L.

Since the total current required for the operation of the circuit 24 is relatively low, the resistor R6 is of relatively high value, and as already mentioned, the resistor R2 is also of relatively high value. Thus any large magnitude voltage transients appearing between the wires L and N are substantially attenuated, before they reach the circuit 24, by these two resistors, which as a further precaution are of a form having low stray capacitance. The circuit 24 is further protected from these voltage transients by being mounted on the shunt 20, since the shunt is a relatively large piece of metal of low resistance in which the generation of high voltages is unlikely. Nevertheless, as a precaution against the possibility of current surges in the shunt 20, the inputs to the amplifier 66 of the circuit 24 are protected by the clamping effect of the diodes D3 and D4 (FIG. 2). Similarly, the input to the amplifier 72 is protected both by the resistor R11 and by the clamping effect of the diodes D5 and D6. These various means for protecting the circuit 24 from the effects of voltage transients do not add significantly to the overall manufacturing cost of the meter 10.

In use, the temperature of the shunt, and therefore its resistance, may vary, and the temperature-compensating resistor R1 serves to correct the errors this temperature variation would otherwise cause. Thus the resistor R1 is selected to have substantially the same temperature coefficient of resistance as the shunt 20, and, since it is in thermal contact with the shunt, follows the temperature variations of the shunt. The ratio R/R1, where R is the resistance of the portion of the shunt 20 between the points 28 and 32, is therefore substantially temperature independent. Since the voltage $V_y$ is given by $V_y = IR$, the voltage $V'_y$ at the output of the amplifier 66 is given by $$V'_y = I.R.R7/R1 \quad (6)$$

and is thus also substantially temperature independent.

It will be noted that since all the components of the meter 10 are effectively connected between the terminal 18 and the terminal 14, the latter terminal being on the supplier's, rather than the consumer's side, of the meter, the operating current consumed by the meter itself does not pass through the shunt 20 and therefore has no effect on the indications produced by the meter.

Several modifications can be made to the meter 10 of FIGS. 1 and 2. For example, the shunt 20 in the wire L can be replaced by a current-sensing transformer, since with the circuit 24 also being connected to the wire L, the aforementioned transient voltages would not appear between the primary and secondary of this transformer. Further, the stepping motor 52 and thyristor T1 can be replaced by a piezoelectric member arranged to be flexed by each pulse produced at the output 50, the counter 54 being arranged to be driven by this flexing: such an arrangement is described in more detail in French patent application No. 76.21224, filed July 12th, 1976.

Alternatively, the thyristor T1, the stepping motor 52 and the counter 54 can be replaced by an electronic counter or register of the type which retains its contents unchanged when its power supply is temporarily removed, e.g. a counter or register using magnetic bubble memory or MNOS storage techniques, and an electronic multi-digit display, e.g. of the seven segment LCD or LED type, connected to display the contents of the counter or register.

Additionally, the power supply for the circuit 24 can take any other convenient transformerless form, for example a form involving the generation of only one power supply voltage with respect to the terminal 14 and wire L. This would of course necessitate some corresponding modifications to the circuit 24. The circuit 24 can also be modified by replacing the voltage-to-frequency converter 62 with an analogue-to-digital converter, arranged to sample the voltage $V_z$ at a predetermined rate and to add the digital signals resulting from these samples into the counter 64 (or other accumulating means) algebraically.

Figure 3A:
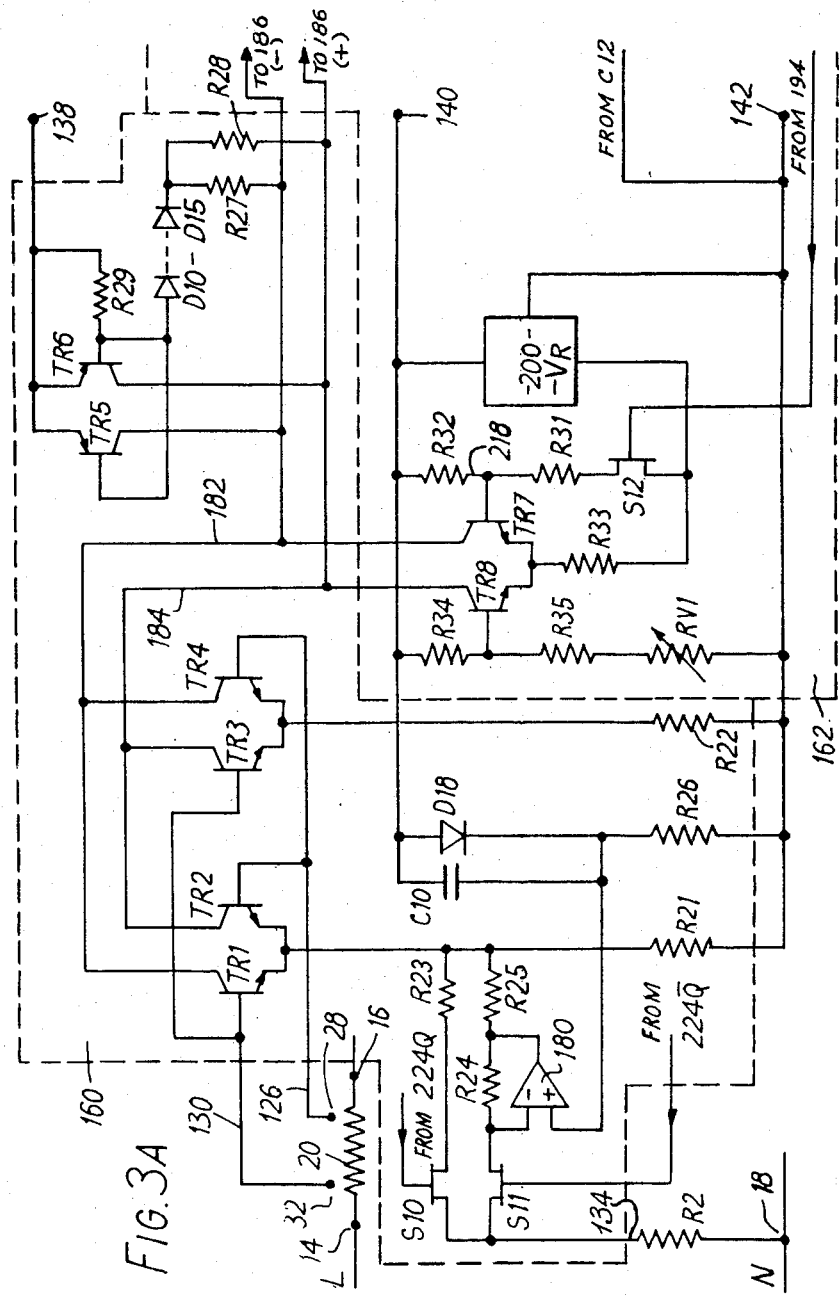
FIG. 3 (made up of FIGS. 3A and 3B) is a circuit diagram of an alternative embodiment of the electronic circuitry of the meter of FIG. 1.
FIG. 3C shows an additional circuit which can be incorporated in the circuitry of FIG. 3.

FIG. 3 shows an alternative embodiment of the circuit 24 of FIGS. 1 and 2, this alternative embodiment being indicated generally at 124. The circuit 124 comprises a multiplier 160, a voltage-to-frequency converter 162 and a reversible counter 164 arranged in a manner analogous to that used for the multiplier 60, converter 62 and counter 64 of the circuit 24, and has inputs 126, 130, 134, 138, 140, 142 and an output 150 which respectively correspond to the inputs 26, 30, 34, 38, 40, 42 and output 50 of the circuit 24; however, the circuit 124 is connected in the meter 10 in a slightly different manner, as will become apparent hereinafter.

The multiplier 160 is of the variable-transconductance type, and comprises first and second emitter-coupled pairs of NPN transistors TR1, TR2 and TR3, TR4 respectively. The bases of the transistors TR1, TR3 are commoned, and are connected to the input 130 of the circuit 124, while the bases of the transistors TR2, TR4 are also commoned, and are connected to the input 126. The inputs 126 and 130 are directly connected to the points 28 and 32 respectively of the shunt 20, the resistor R1 of FIG. 1 being omitted.

The commoned emitters of the transistors TR1, TR2 and of the transistors TR3, TR4 are connected via respective equal resistors R21, R22 to the negative power supply input 142.

The resistor R3 of FIGS. 1 and 2 is also omitted, so that the input 134 of the circuit 124 is externally connected only to the terminal 18 (via the relatively high value resistor R2). The input 134 is internally connected via the series combination of a semiconductor switch S10 and a resistor R23 to the commoned emitters of the transistors TR1, TR2, and via another semiconductor switch S11 to the inverting input of a differential amplifier 180. The switches S10 and S11 are operated in antiphase by respective square wave signals of 1:1 mark-space ratio, as will be described hereinafter. The output of the amplifier 180 is connected via respective resistors R24, R25 equal in value to the resistors R21, R22 to its inverting input and to the commoned emitters of the transistors TR1, TR2, while the non-inverting input of the amplifier 180 is connected via the parallel combination of a capacitor C10 and a forward-biassed diode D18 to the zero volt power supply input 140 and via a resistor R26 to the negative power supply input 142.

The collectors of the transistors TR1, TR4 are commoned at 182, while the collectors of the transistors TR2, TR3 are commoned at 184, the points 182, 184 constituting the output of the multiplier 160. The points 182, 184 are connected via respective equal resistors R27, R28 to one end of a chain of several (e.g. six)

series-connected diodes D10 to D15, the other end of the diode chain being connected to the respective bases of a pair of PNP transistors TR5, TR6. The bases of the transistors TR5, TR6 are connected via a resistor R29 to the positive power supply input 138, and the emitters of these transistors are connected to the input 138. The collectors of the transistors TR5, TR6 are connected to the points 182 and 184 respectively.

Figure 4:
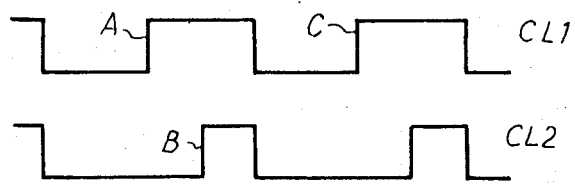
FIG. 4 is an explanatory diagram showing the electrical waveforms of two signals employed in the circuitry of FIG. 3.

The points 182, 184 are connected to the inverting and non-inverting inputs respectively of a differential amplifier 186, which inputs constitute the input of the voltage-to-frequency converter 162. The output of the amplifier 186 is negative-feedback connected to its inverting input via a capacitor C11 to form an integrator, and is also connected via a resistor R30 to the input of a voltage level detector 188. The input of the detector 188 is connected via a capacitor C12 to the negative power supply input 142, while the output of the detector 188 is connected to the set input of a bistable circuit 190. The set output of the bistable circuit 190 is connected to the set input of a clocked bistable circuit 192, whose set output is connected to one input of a two-input AND gate 194. The clock input of the bistable circuit 192 and the reset input of the bistable circuit 190 are connected to receive respective clock signals CL1 and CL2 produced by a clock pulse generator 196, and the other input of the AND gate 194 is connected to receive the clock signal CL1 via two cascaded inverters 198, 199. The clock pulse generator includes a crystal controlled oscillator (not shown) having a typical operating frequency of 32768 Hz, and frequency divider and gating circuits (not shown) arranged in a known manner to produce the clock signals CL1 and CL2 at a common frequency, typically 8192 Hz, with waveforms as shown in FIG. 4.

The output of the AND gate 194 is connected to the control input or gate of a semiconductor switch S12, which is connected between a negative reference voltage source 200 similar to the source $-V_R$ of FIG. 2 and one end of a resistor R31. The other end of the resistor R31 is connected to the base of an NPN transistor TR7, and via a resistor R32 to the zero volt power supply input 140. The resistor R32 is mounted, externally of the circuit 124, in thermal contact with the shunt 20, in place of the resistor R1 of FIGS. 1 and 2: the circuit 124 is provided with an additional input 218 to permit this. The emitter of the transistor TR7 is connected to the emitter of an NPN transistor TR8, to form yet another emitter-coupled pair, the commoned emitters being connected via a precision resistor R33 to the reference voltage source 200. The base of the transistor TR8 is connected to the zero volt power supply input 140 via a resistor R34 and to the negative power supply input 142 via the series combination of a resistor R35 and an adjustable resistor RV1. The collectors of the transistors TR7, TR8 are connected to the inverting and non-inverting inputs respectively of the amplifier 186.

The output of the AND gate 194 constitutes the output of the voltage-to-frequency converter 162, and is connected via a buffer amplifier 202 to the count input 203 of the reversible counter 164. The counter 164 is a 12 bit binary counter of the presettable type, and has an up/down control input 204, a preset input 206, and a set of inputs 208 to which a digital signal representative of a desired presettable count is permanently applied. The counter 164 also has a set of count outputs 210, which are connected to a decoder 212 arranged to produce an output pulse when the counter reaches a predetermined count. The output of the decoder 212 is connected to the set input of a bistable circuit 214, whose reset input is connected to receive an inverted version of the clock signal CL1, e.g. from the inverter 198. The set output of the bistable circuit 214 is connected to the preset input 206 of the counter 164, and constitutes the output 150 of the circuit 124.

The aforementioned antiphase signals for controlling the switches S10, S11 are generated by a circuit 216 comprising a high value resistor R35 (typically 680 K Ω) connected between the terminal 18 of the meter 10 and a further input 220 of the circuit 124. The input 220 is connected via a capacitor C13 to the negative power supply input 142, and via the series combination of a resistor R36 and a squaring amplifier 222 to the clock input of a clocked bistable circuit 224. The set output of the bistable circuit 224 is connected to the control input of the switch S10 and to the up/down control input 204 of counter 164, while the reset output of this bistable circuit is connected to the control input of the switch S11 and to its set input.

The operation of the circuit 124 is as follows.

Firstly, the squaring amplifier 222 in the circuit 216 produces a square wave signal whose frequency is equal to the frequency of the voltage V between the wires L and N (i.e. equal to the normal line frequency of 50 Hz or 60 Hz). This square wave signal is applied to and frequency-divided by the bistable circuit 224, which produces at its set and reset outputs respectively antiphase square wave signals of 1:1 markspace ratio and at half the line frequency. These two antiphase signals, which will be assumed to be at 25 Hz, render the switches S10 and S11 alternatively conductive and non-conductive in antiphase, i.e. when the switch S10 is conductive, the switch S11 is not, and vice versa.

The resistor R2 serves to pass a current $I_x$ which is proportional to the voltage V between the wires L and N and which constitutes a first input to the variable-transconductance multiplier 160 of the circuit 124. Thus the resistor R2 is operative, via each of the switches S10, S11 in turn, to vary the current flowing in the commoned emitters of the transistors TR1, TR2 by an amount equal to $I_x$, the polarity of this current variation being reversed, during each alternate half-cycle of the antiphase square waves for which the switch S11 is conductive, by the unity gain inverting amplifier based upon the amplifier 180. The current variation is effective to vary the transconductance of the transistors TR1, TR2.

The current shunt 20 produces between the points 28 and 32 thereof, as already described, a voltage $V_y$ whose instantaneous magnitude is proportional to the instantaneous magnitude of the current I flowing in the wire L. The voltage $V_y$ is also applied to the multiplier 160, between the respective bases of the transistors TR1, TR2.

The transistors TR1 and TR2 therefore tend to produce an output voltage $V_o$ between their respective collectors (i.e. between the points 182, 184) proportional to the product $V_y I_y$. This output voltage would, if the transistors TR1 and TR2 were used alone, contain a large and undesirable common-mode component, and the transistors TR2, TR4 are provided to substantially eliminate this common-mode component: they achieve this by virtue of the fact that they receive the same input voltage $V_y$, but their output (i.e. their collectors) is cross-coupled with the output (i.e. the collectors) of the transistors TR1, TR2.

The voltage $V_o$ is algebraically combined at the points 182, 184 with an offset voltage which the transistors TR7, TR8 in the voltage-to-frequency converter 162 tend to produce when the switch S12 is not conductive. This offset voltage is adjusted by means of the variable resistor RV1 to be negative and larger than the normal full scale negative value of $V_o$, so that the difference voltage applied to the integrator based on the amplifier 186 (i.e. applied to the input of the converter 162) when the switch S12 is not conductive is always negative. This difference voltage therefore causes the output of the amplifier 186 to ramp positively, at a rate dependent upon its magnitude, to trigger the detector 188.

The detector 188, when triggered, sets the bistable circuit 190, which in turn conditions the bistable circuit 192 to be set by the next rising edge of the clock signal CL1 (indicated by way of example at A in FIG. 4). The bistable circuit 192 enables the AND gate 194, so that the switch S12 is rendered conductive by the same rising edge of the clock signal CL1. The next rising edge of the clock signal C12, indicated at B in FIG. 4, resets the bistable circuit 190, thus conditioning the bistable circuit 192 to be reset by the next rising edge of the clock signal CL1. The resetting of the bistable circuit 192 disables the AND gate 194, thus rendering the switch S12 non-conductive again. The switch S12 is therefore rendered conductive for a precisely defined time equal to one period of the clock signal CL1.

When the switch S12 is rendered conductive, it changes the aforementioned offset voltage produced by the transistors TR7, TR8 by a precisely defined amount sufficient to render the aforementioned difference voltage positive and thereby cause the output of the amplifier 186 to ramp negatively to a level below the detection level of the detector 188. Once the switch S12 becomes non-conductive again, the sequence of events just described is repeated.

It will be appreciated that the maximum frequency at which the switch S12 can be rendered conductive, i.e. the maximum output frequency of the converter 162, is 8192 Hz. The variable resistor RV1 is adjusted such that with zero current flowing in the shunt 20, the output frequency of the converter is about half the maximum frequency, i.e. 4096 Hz. Then, when the current flowing in the shunt is not zero, the resulting voltage $V_o$ which the transistors TR1, TR2 tend to produce changes the aforementioned difference voltage by a corresponding amount, so that the frequency of operation of the switch S12 increases or decreases from 4096 Hz in dependence upon whether $V_o$ is negative or positive respectively, and by an amount dependent upon the magnitude of the product V.I. The voltage-to-frequency converter 162 therefore produces at its output (i.e. at the output of the AND gate 194) a pulse signal whose frequency is dependent upon the magnitude of the product V.I.

The pulses of the pulse signal produced by the converter 162 are applied to and counted in the reversible counter 164. It will be recalled that the 25 Hz square wave signal which controls the switch S11 also controls the direction of counting of the counter 164, so that the counter counts upwardly when the switch S10 is conductive and downwardly when the switch S11 is conductive. Thus since the switches S10 and S11 also change the polarity of the ratio $V_o/V$, the number N of pulses supplied to the counter 164 during one period of the 25 Hz square wave signal commencing at a time $t_1$ is given by $$N = \left[ fo + k \int_{t_1}^{t_1 + T/2} V.I.\, dt \right] \frac{T}{2} - $$

$$\left[ fo - k \int_{t_1 + T/2}^{t_1 + T} V.I.\, dt \right] \frac{T}{2}$$

which simplifies to $$N = \frac{kT}{2} \int_{t_1}^{t_1 + T} V.I.\, dt$$

where:
  $fo$ is the frequency of the pulses when $i=0$;
  T is the period of the 25 Hz square wave signals; and
  k is a constant of proportionality.
Thus the number of pulses counted by the counter 164 is proportional to the time integral of the product V.I.

It will be appreciated that the counter 164 has a full house count of $2^{12}$, or 4096. However, each time the counter 164 reaches a predetermined count, typically about $\frac{7}{8}$ of its full house count (i.e. a count of 3584), the decoder 212 produces an output pulse which resets the counter to its presettable count, which is typically chosen to be about $\frac{1}{8}$ of its full house count (i.e. a count of 512). Thus although the counter 164 counts both upwardly and downwardly it can count only upwardly through the predetermined count which produces an output pulse at the output 150, i.e. if it counts upwardly to a count of 3584 and produces an output pulse, and then immediately counts downwardly, the downward counting will commence from the presettable count of 512. The production of spurious output pulses at the output 150 is thus avoided.

The pulses appearing at the output 150 are counted as described in relation to FIGS. 1 and 2, their accumulated total representing the total amount of energy supplied via the wires L and N.

For satisfactory operation of the circuit 124, it is desirable that the characteristics (such as current gain) of at least the transistors TR1 to TR4 and TR7, TR8 be closely matched: however, since the circuit 124 is implemented as a single integrated circuit device as described in relation to the circuit 24 of FIGS. 1 and 2, this requirement is relatively easily realisable in practice.

The circuit 124 has several important advantages, of which the most significant is perhaps the way the thermal drifts and offsets inherent in the variable-transconductance multiplier 160 incorporated therein are substantially self-cancelling. Thus, considering equation (7), in the same period of the 25 Hz square wave signal referred to in equation (7), these drifts and offsets can be considered of constant magnitude, so they merely have the effect of changing $fo$ by a small constant amount: they are thus cancelled out with $fo$ by the operation of the switches S10, S11 and the corresponding changing of the direction of counting in the counter 164.

Additionally it will be appreciated that the transistors TR7, TR8 effectively operate as a multiplier, analogous to that formed by the transistors TR1 to TR4, to produce a reference signal used to oppose the product-dependent signal ($V_o$) produced by the transistors TR1 to TR4: thus possible errors due to long term changes, i.e. ageing, in the characteristics of the transistors TR1 to TR4 tend to be cancelled by corresponding changes in the characteristics of the transistors TR7, TR8, owing to the aforementioned close matching of the characteristics of these transistors achieved by integrated circuit implementation.

Errors due to temperature variations of the shunt 20 are substantially eliminated by the resistor R32, which, since it is mounted in thermal contact with the shunt and has substantially the same temperature coefficient of resistance, changes the reference feedback signal produced by the transistors TR7, TR8 when the switch S12 is conductive in proportion to the temperature-induced change in the resistance value of the shunt.

The transistors TR5 and TR6 operate as constant current sources to maintain the respective currents flowing into the points 182, 184 from the positive power supply input 138 at substantially constant equal values determined by the mean of the respective voltages at these points. However, if desired the transistors TR5, TR6 and their associated biassing circuitry can be replaced by two equal value resistors connected between the input 138 and the points 182, 184 respectively.

Another modification which can be made to the circuit 124 is to eliminate the amplifier 180 and the associated resistors R24-R26 and capacitor C10, and to connect the output of the switch S11 to the commoned emitters of the transistors TR3, TR4, so that the switches S10, S11 operate to reverse the effective polarity of the current $I_x$ applied to the multiplier 160. The circuit 124 can also be modified by replacing the converter 162 with an analogue-to-digital converter, as described earlier in relation to the circuit 24, in which case the polarity with which the digital signals produced by this converter are accumulated in the counter 164 (or other accumulating means) would be periodically reversed by the appropriate 25 Hz square wave signal.

Since the frequency of the square wave signals which control the switches S10, S11 and the direction of counting of the counter 164 is not critical, another modification which can be made to the circuit 124 is to replace the circuit 621 by a divide-by-256 frequency divider circuit connected to receive the clock signal CL1 or CL2 from the clock pulse generator 196 and a divide-by-two bistable circuit connected to receive the output of the divide-by-256 circuit. This bistable circuit therefore produces two antiphase 16 Hz square waves which can be used in place of the 25 Hz square waves.

It should be noted that the drift cancellation technique described in relation to the circuit 124 can be used with minor modifications in other circuits incorporating multipliers, for example in the circuit 24 of FIG. 2.

Figure 3B:
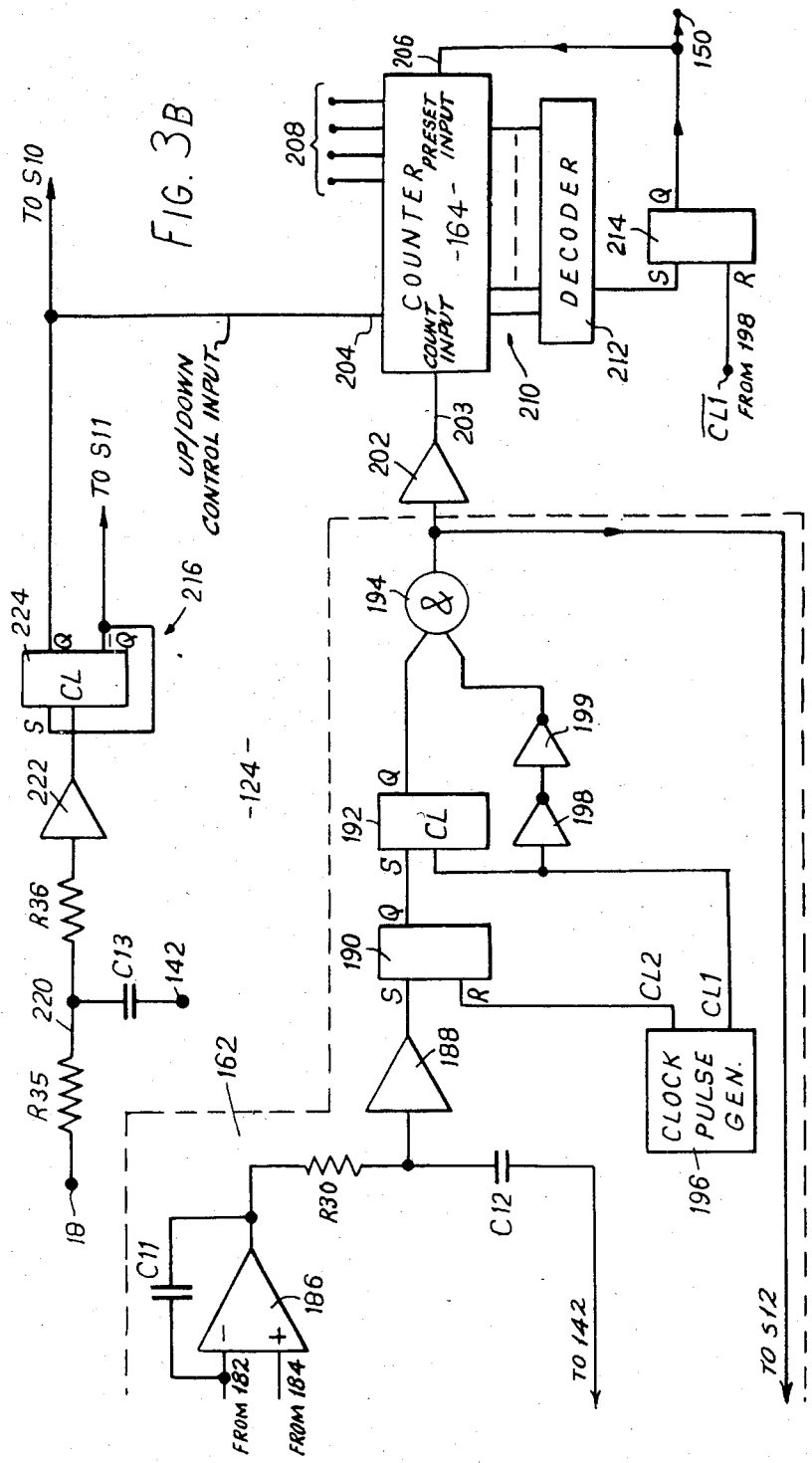
Figure 3C:
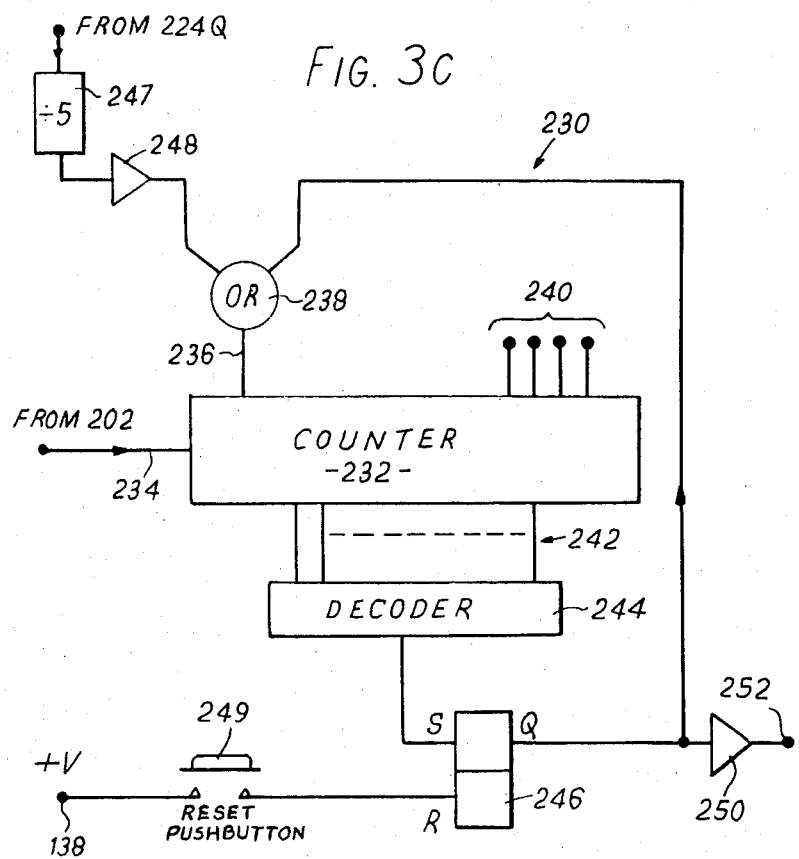

FIG. 3C shows an overload protection circuit which can readily be incorporated in the circuit 124. This overload protection circuit is indicated generally at 230, and comprises a reversible binary counter 232 of the presettable type. The counter 232 has a count input 234, which is connected to the output of the amplifier 202 of FIG. 3B, a preset input 236 connected to the output of a two-input OR gate 238, and a set of inputs 240 to which a digital signal representative of a desired presettable count is permanently applied. The counter 232 also has a set of count outputs 242, which are connected to a decoder 244 arranged to produce an output pulse when the counter 232 reaches a predetermined count. The output of the decoder 244 is connected to the set input of a bistable circuit 246, whose set output is connected to one input of the OR gate 238. The other input of the OR gate 238 is connected to receive one of the 25 Hz signals from the circuit 216 of FIG. 3B via a divide-by-five frequency divider circuit 247 and pulse shaping circuit 248.

The reset input of the bistable circuit 246 is connected to a suitable voltage source (e.g. the positive power supply rail 138) via a "reset" push-button 249 accessible from outside the housing 12 of the meter 10, while the set output of this bistable circuit is also connected via a suitable amplifier 250 to an output 252 of the circuit 124. This output 252 is connected to a circuit-breaker (not shown) connected in the wires L and N on the consumer's side of the meter 10. This circuit breaker can, if desired, be incorporated in the meter 10, i.e. disposed in the housing 12 in which case the push-button 249 can also serve as the reset button of the circuit breaker.

In operation, the counter 232 counts the same pulses that are counted by the counter 164 of FIG. 3B. However, the counter 232 is reset to its preset count every 200 milliseconds by the 5 Hz pulses derived from the divider circuit 247 and pulse shaping circuit 248, and can thus count continuously for only 200 milliseconds at a time.

The predetermined count at which the decoder 244 produces an output pulse is selected such that the counter 232 does not attain this predetermined count under normal maximum load conditions (i.e. with the maximum permitted load connected to the wires L and N on the consumer's side of the meter 10), but does attain the predetermined count when the normal maximum load conditions are exceeded by a specified amount i.e. when an overload occurs. When such an overload occurs, and the counter 232 therefore attains the predetermined count, the output pulse produced by the decoder 244 is operative to set the bistable circuit 246, which in turn operates the aforementioned circuit-breaker via the amplifier 250 provided for that purpose, thereby cutting off the supply of electrical power to the consumer. The bistable circuit 246 also resets the counter 232 to its preset count via the OR gate 238. Once the cause of the overload has been found and removed, the supply of electrical power can be restored by means of the reset button 249.

Figure 5:
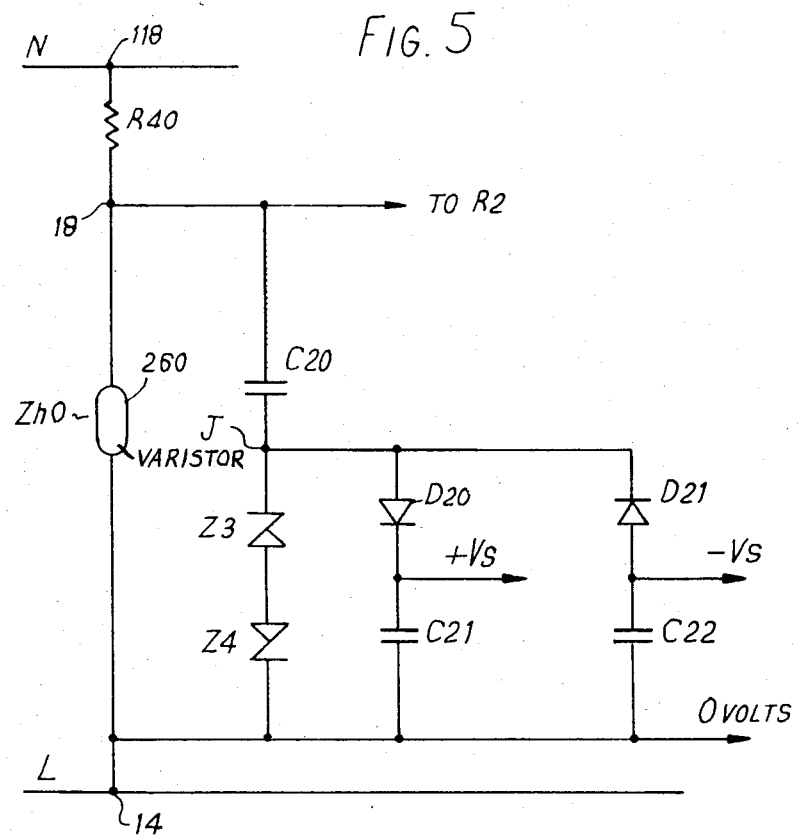
FIG. 5 is a circuit diagram of an alternative power supply for use in the meter of FIG. 1.

FIG. 5 shows an alternative and simplified power supply for use with the circuit 24 or 124. In the power supply of FIG. 5, the terminal 18 is not connected directly to the reference or neutral wire N, but is connected to one end of a relatively low value resistor R40 whose other end is connected directly to the wire N at a terminal 118. A surge limiting device 260, constituted by a varistor or voltage sensitive resistor of the ZnO type, is connected between the terminal 18 and the terminal 14, and limits the voltage between these two terminals, typically to a maximum value of about 600 volts.

The terminal 18 is connected, via a capacitor C20 and two oppositely-directed zener diodes Z3, Z4 in series, to the terminal 14, the zener diodes serving to limit the amplitude of the AC voltage at the junction J between the capacitor C20 and the zener diodes to a low value, typically about 8 volts. The junction J is connected to the terminal 14 via the series combination of a diode D20 and a capacitor C21, and via the series combination of a diode D21 and a capacitor C22, the diodes D20 and D21 being oppositely directed. A positive DC power supply voltage $+V_s$ of about $+7$ volts is therefore produced at the cathode of the diode D20, while a negative DC power supply voltage $-V_s$ of about $-7$ volts is produced at the anode of the diode D21.

Figure 6:
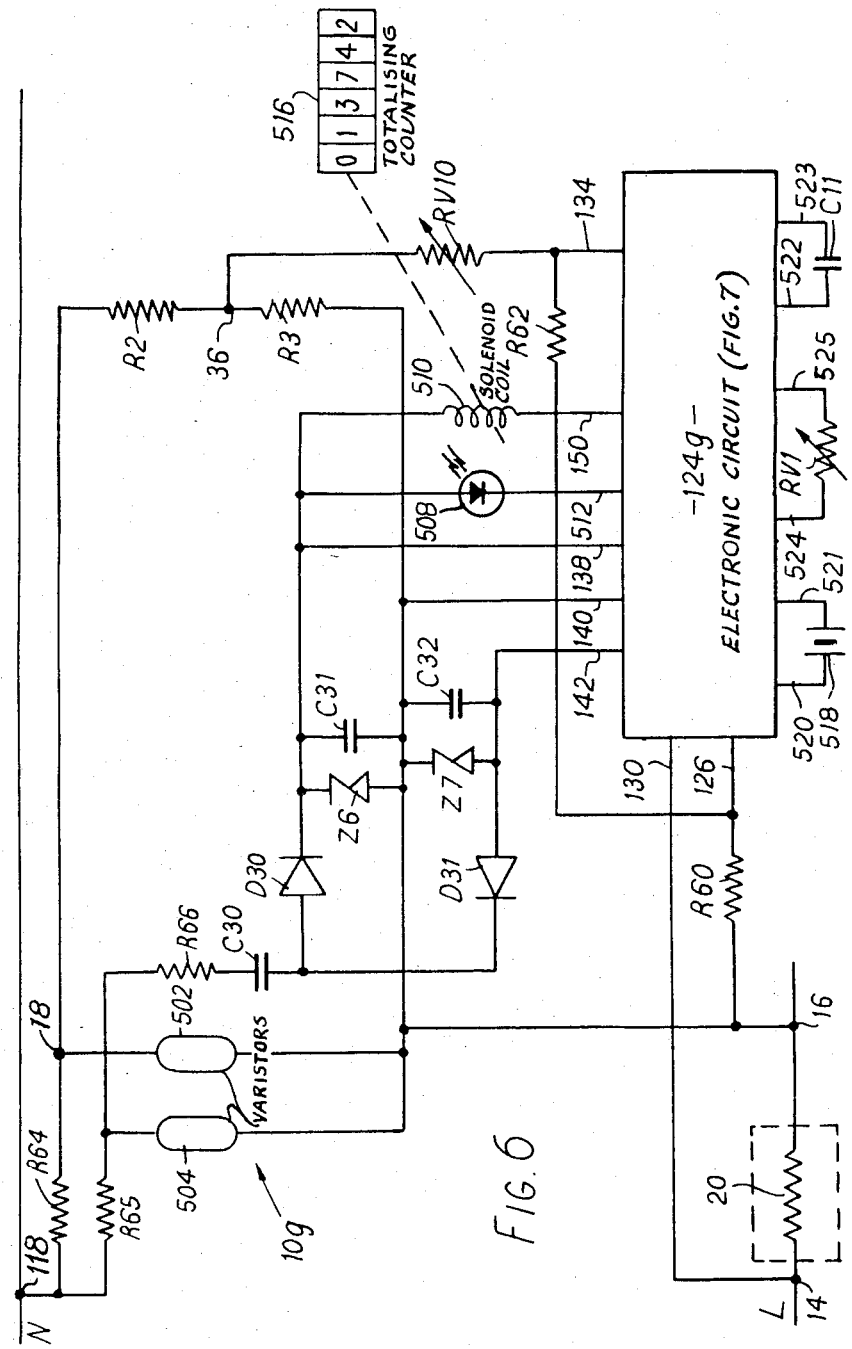
FIG. 6 is a diagrammatic representation of another embodiment of the meter of FIG. 1, also in accordance with the invention.

The electronic watthour meter of FIGS. 6 and 7 is indicated generally at 10g in FIG. 6, and is similar in many respects to the meter 10 of FIG. 1. Additionally, the meter 10g incorporates an integrated electronic circuit 124g similar to the circuit 124 of FIGS. 3A and 3C. Consequently, in the description of FIGS. 6 and 7 which follows, elements corresponding to elements of FIGS. 1 and 3 will bear corresponding references, and only the points of difference will be described in detail.

In the meter 10g of FIG. 6, the input 126 of the circuit 124g is connected to the terminal 16 via a low-value resistor R60, and to the input 134 via another resistor R62, while the input 130 is connected to the terminal 14. The input 134 of the circuit 124g, instead of being directly connected to the junction 36 between the resistors R2 and R3, is connected thereto via a variable resistor RV10. The end of the resistor R2 remote from the junction 36 is connected to the terminal 18, which is connected in turn to the terminal 118 via a resistor R64, and to the terminal 16 via a surge limiting varistor 502 of the ZnO type.

The terminal 18 is connected via resistors R65, R66 and a capacitor C30 in series to the anode of a diode D30 and to the cathode of a diode D31. A further surge-limiting varistor 504 of the ZnO type is connected between the terminal 16 and the junction between the resistor R65 and the capacitor C30. The cathode of the diode D30 and the anode of the diode D31 are both connected to the terminal 16 via respective parallel combinations of a zener diode and a smoothing capacitor, Z6 with C31, and Z7 with C32, and thus respectively constitute positive and negative power supply points with respect to the terminal 16: as such, they and the terminal 16 are respectively connected to the positive, negative and zero power supply inputs 138, 142 and 140 of the circuit 124g.

The cathode of the diode D30 is also connected, via a light-emitting diode 508 and a solenoid coil 510 respectively, to an auxiliary output 512, and the output 150 of the circuit 124g. The solenoid coil 510 forms part of a conventional solenoid-operated totalising counter 516 of the kind used in telephone billing meters.

The circuit 124g also has a pair of inputs 520, 521 between which is connected a crystal 518 forming part of the clock 196 within the circuit 124g, a pair of inputs 522, 523 between which is connected the capacitor C11 of the voltage-to-frequency converter 162, and a pair of inputs 524, 525 between which is connected the variable resistor RV1 of the converter 162.

The circuit 124g is shown in more detail in FIG. 7, in which the variable-transconductance multiplier, the voltage-to-frequency converter and the reversible counter are again indicated by the references 160, 162 and 164 respectively.

In the multiplier 160 (FIG. 7A), the switches S10, S11 and their associated circuitry in the circuit 124 of FIG. 3 (which switches and associated circuitry periodically reverse the polarity of the multiplier input signal representative of the voltage V between the wires L and N) are replaced by a chopper circuit comprising four transistors TR11 to TR14, each having its collector connected to the zero volt power supply input 140. The bases of the transistors TR11, TR13 are connected to a common point 530 via respective resistors R70, R71, while the bases of the transistors TR12, TR14 are connected to a common point 532 via respective resistors R72, R73. The emitters of the transistors TR11, TR14 are connected via equal value resistors R74, R75 to the input 134 of the circuit 124g, and, via two further resistors R76, R77 equal in value to the resistors R74, R75, to respective chopper output points 534, 536. The emitters of the transistors TR12, TR13 are connected to the points 534 and 536 respectively via equal resistors R78, R79 whose common value is 1.5 times that of the common value of the resistors R74 to R77.

The chopper output points 534, 536 are connected to the bases of respective transistors TR15, TR16, whose collectors are connected to the positive power supply input 138, and whose emitters are connected to the bases of respective transistors TR17, TR18. The collectors of the transistors TR17, TR18 are respectively connected to the commoned emitters of the transistors TR1, TR2 and to the common emitters of the transistors TR3, TR4, while their emitters are connected via resistors R80, R81, equal in value to the resistors R74 to R77, to the collector of a transistor TR19. The transistor TR19 has its emitter connected to the negative reference voltage source 200, and is arranged to operate as a constant current source by means of a resistor R82 connected between its base and the zero volt supply input 130 and a transistor TR20 connected as a diode (i.e. with its collector and base commoned) between the base and emitter of the transistor TR19. The resistors R21, R22 of the circuit 124 of FIG. 3 are omitted from the circuit 124g.

The transistors TR5, TR6 of the circuit 124 of FIG. 3, and their associated circuitry, are replaced by two resistors R82, R83 connected from the points 182, 184 respectively to the positive power supply input 138 and two resistors R84, R85 connected from the points 182, 184 respectively to the zero volt power supply input 140.

In the voltage-to-frequency converter 162, the switch S12 is replaced by a transistor switch TR21, the resistor R35 is omitted and the variable resistor RV1 is connected in series with another transistor switch TR22 between the base of the transistor TR8 and the negative reference voltage source 200. Additionally, and as shown in FIG. 7B, the AND gate 194 and inverters 198, 199 are omitted, and the clock signal CL1 is applied to the reset input of the bistable circuit 192. The Q output of the bistable circuit 192 now constitutes the output of the converter 162 and is therefore connected back to the base of the transistor switch TR21. The Q output of the bistable circuit 192 is also connected to one input of a two-input AND gate 540, whose output is connected to the base of the transistor switch TR22.

The output of the voltage-to-frequency converter 162 (FIG. 7B) is connected to one input of an EXCLUSIVE-OR gate 542, whose other input is connected to the output of a two-input AND gate 544. The AND gate 544 is connected to receive the clock signal CL1 and a 4096 Hz clock signal produced by frequency dividing the cock signal CL1 by two in a bistable circuit 546. The output of the EXCLUSIVE-OR gate 542 is connected to one input of a two-input AND gate 548, whose other input is connected to receive the clock signal CL2. The output of the AND gate 548 is connected to the count input 203 of the counter 164.

The counter 164 is an eight bit counter, so that its full house count is two hundred and fifty six: its presettable count, determined by the signals at its inputs 208, is sixty four. The decoder 212 has a first output 550 at which it produces an output signal when the count in the counter 164 reaches two hundred and forty while counting upwardly, and a second output 552 at which it produces an output signal when the count in the counter 164 reaches two while counting downwardly. The output 550 is connected to the bistable circuit 214, while the output 552 is connected to one input of a two-input OR gate 554. The other input and the output of the OR gate 554 are respectively connected to the Q output of the bistable circuit 214 and to the preset input 206 of the counter 164.

The Q output of the bistable circuit 214 is also connected to the count input of a simple five bit binary counter 556. The counter 556 has a main output 558 at which it produces an output signal when it reaches a count of sixteen, and an auxiliary output 560 (actually the output of its first binary stage) at which it produces an output signal at half the frequency of the signal applied to its count input. The output 560 is connected via an amplifier 562 to the output 512 of the circuit 124g. The output 558 is connected to the set input of a bistable circuit 564, whose reset input is connected to receive the clock signal CL1. The Q output of the bistable circuit 564 is connected to the reset input of the counter 556, and to the set output of a bistable circuit 566 whose Q output is connected to the set input of a bistable circuit 568. The set output of the bistable circuit 568 is connected to the other input of the AND gate 540, to the reset input of the bistable circuit 566 and to one input of a two-input AND gate 570. The clock input of the bistable circuit 568, and the other input of the AND gate 570, are connected to receive an 8 Hz square wave reference signal, as will hereinafter become apparent, while the output of the AND gate 570 is connected via an amplifier 572 to the output 150 of the circuit 124g.

The antiphase signals for controlling the chopper circuit based on the transistors TR11 to TR14 (one of which signals, it will be recalled, also controls the counting direction of the counter 164) are generated from the 4096 Hz square wave signal at the $\overline{Q}$ output of the bistable circuit 546 by way of a divide-by-256 frequency divider circuit 574. The output of the divider circuit 574 is connected to the clock input of a bistable circuit 576 and, via an inverter 577, to the reset input of a bistable circuit 580. The set and reset inputs of the bistable circuit 576 are respectively connected to receive a permanent logic level 1 signal and a clock signal CL3, this latter merely being an inverted version of the basic 32768 Hz clock signal from which the clock signals CL1 and CL2 are generated within the clock pulse generator 196.

The Q output of the bistable circuit 576 is connected to the respective clock inputs of a bistable circuit 578 and the bistable circuit 580, while the Q output of the bistable circuit 578 is connected to one input of a two input NAND gate 581. The $\overline{Q}$ output of the bistable circuit 578 is connected back to its set input, and to both the clock input of the bistable circuit 568 and the other input of the AND gate 570.

The output of the NAND gate 581 is connected to the set input of the bistable circuit 580, whose Q output is connected to the clock input of a bistable circuit 582. The other input of the NAND gate 581 is connected to the output of an EXCLUSIVE-OR gate 584, whose two inputs are connected to the respective outputs of two further EXCLUSIVE-OR gates 585, 586. The four inputs of the gates 585, 586 are connected to the respective outputs of the four least significant bits of the counter 164.

Figure 7A:
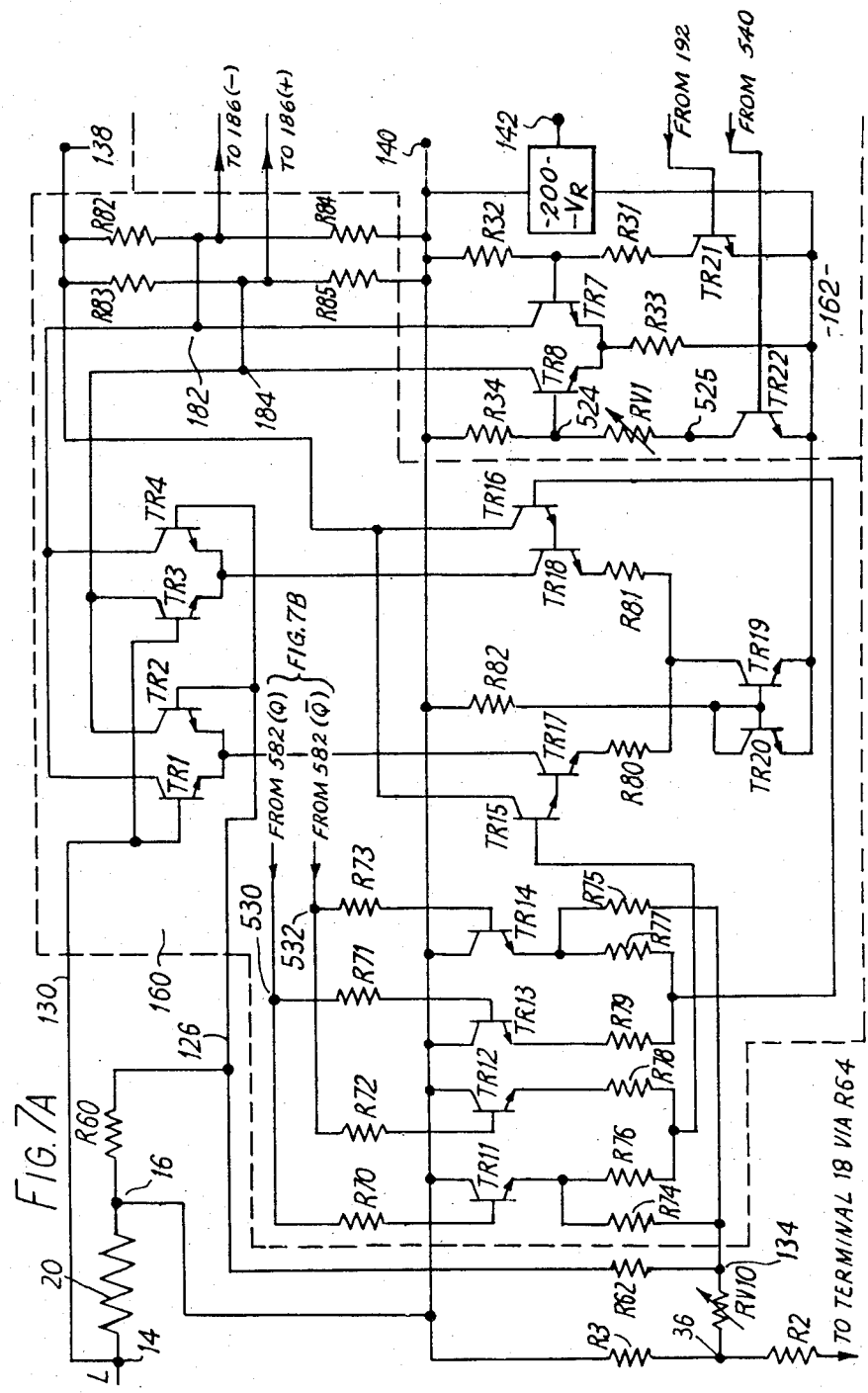
FIG. 7 (made up of FIGS. 7A and 7B) is a circuit diagram of the electronic circuitry of the meter of FIG. 6.
Figure 7B:
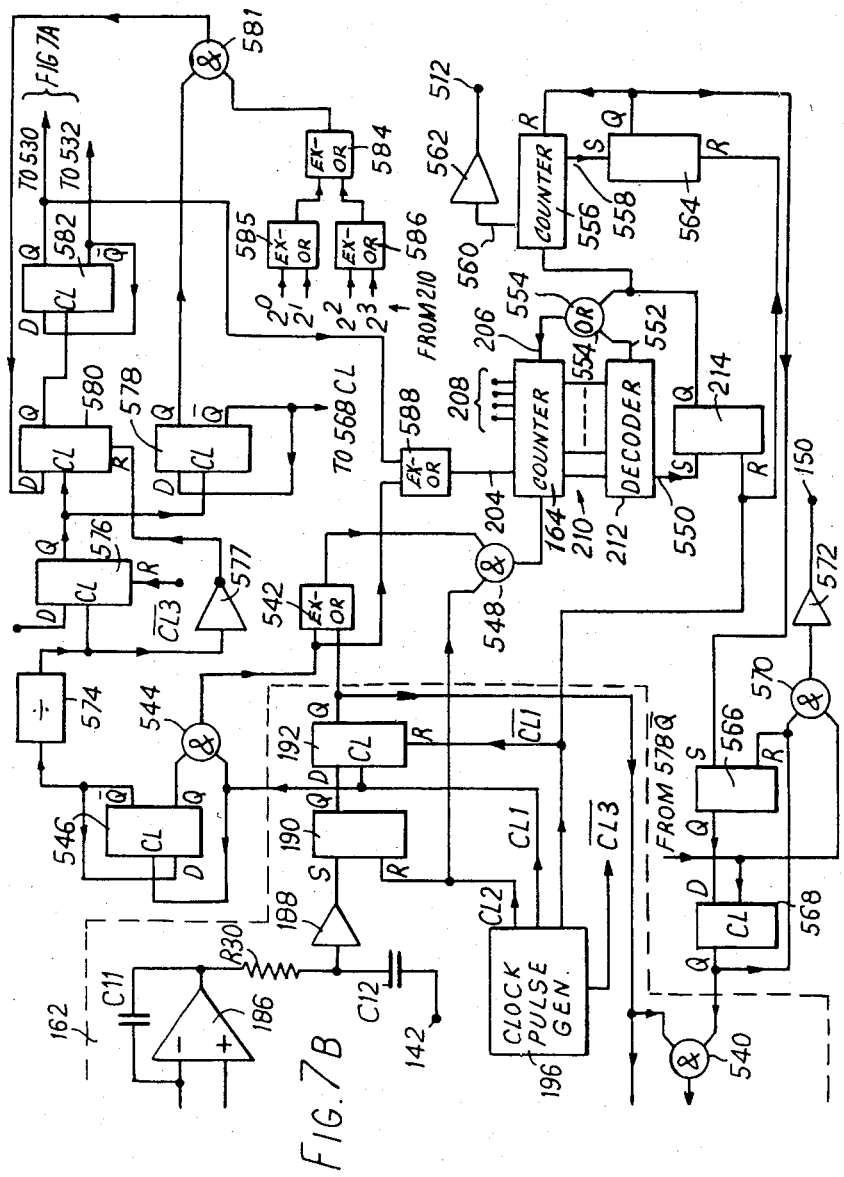

The aforementioned antiphase chopper control signals are produced at the Q and $\overline{Q}$ outputs of the bistable circuit 582, which outputs are therefore connected to the points 530 and 532 respectively of FIG. 7A. The Q output of the bistable circuit 582 is also connected to one input of an EXCLUSIVE-OR gate 588, whose other input is connected to the output of the AND gate 544 and whose output is connected to the up/down control input 204 of the counter 164.

The principle of operation of the circuit 124g of FIG. 7, and therefore of the meter 10g of FIG. 6, is basically similar to that of the circuit 124 of FIG. 3 and the meter of FIG. 1, so again only the significant points of difference will be explained in detail.

The resistors R60 and R62 connected between the terminal 16 and the input 134 of the circuit 124g, with their junction connected to the input 126, serve to offset the current-representative input voltage between the inputs 126, 130 very slightly, such that with no power being supplied via the wires L and N, the circuit 124g receives input signals indicative of a very low level negative or reverse power. The counter 164 therefore tends to count downwardly very slowly, but whenever its count decreases to two, the decoder 212 resets it to its preset count of sixty-four. It will be appreciated that this arrangement ensures that when no power is being supplied via the wires L and N, even for prolonged periods, there is no possibility of the circuit 124g producing output pulses to augment the count in the totalisator 516.

The effect of the slight offset produced by the resistors R60, R62 when power is being supplied via the wires L and N is compensated during calibration by adjustment of the variable resistors RV10 and RV1.

In the chopper circuit based on the transistors TR11 to TR14, the anti-phase square wave signals applied at the points 530 and 532, whose generation will be described hereinafter, are operative first to render the transistors TR11, TR13 conductive and the transistors TR12, TR14 non-conductive, and then vice-versa, in alternation and at 8 Hz. Thus a voltage $V'_x$, representative of the voltage V between the wires L and N, appears alternately at the points 534 and 536, and is therefore applied alternately to the respective basis of the transistors TR15 and TR16. It will be noted that the source impedance presented to the base of each of the transistors TR15, TR16 is constant, irrespective of which pair of the transistors TR11 to TR14 is conductive, owing to the choice of the relative values of the resistors R74 to R79.

The transistors TR15 to TR18, together with the transistors TR19, TR20, form a differential amplifier, the points 534 and 536 constituting the differential inputs of the amplifier: thus the voltage $V'_x$ has its effective polarity reversed as it is switched between the points 534, 536 and in either case, is operative to vary the respective currents flowing at the commoned emitters of the transistor pairs TR1, TR2 and TR3, TR4 in opposite senses, i.e. in antiphase.

The arrangement of the chopper based on the transistors TR11 to TR14 and the differential amplifier based on the transistors TR15 to TR20 further reduces undesired common mode signals at the points 182, 184, which is one of the factors permitting the transistors TR5, TR6 of the circuit 124 of FIG. 3 to be omitted from the circuit 124g.

At high values of the power supplied via the wires L and N, the error curve for the circuit 124 of FIG. 3 shows a slight tendency to negative error values (lower power measurement). This is corrected in the circuit 124g by switching the transistor TR22 in addition to the transistor TR21, thus effectively reducing the reference signal produced by the transistors TR7, TR8 to oppose the output signal of the transistor pairs TR1, TR2 and TR3, TR4. The transistor TR22 is controlled via the AND gate 540, which is enabled each time an output pulse is produced by the counter 556 for precisely one or several complete periods of, and in synchronism with, the aforementioned 8 Hz reference signal applied to the bistable circuit 568: thus the higher the measured power, the more often the AND gate 540 is enabled.

Under certain circumstances, the output frequency of the voltage-to-frequency converter 162 can behave as if it has become locked to a submultiple of the clock frequency. At zero power, this can sometimes result in fairly rapid drift in the count in the counter 164, for example when an up-counting period systematically includes one pulse more or less than the following down-counting period. Although it can be shown that in the long term, errors due to this "locking" phenomenon cancel out, in the short term they can possibly cause problems, for example during calibration. To avoid these problems, the phase of the antiphase chopper control signals, and of the up/down control signal for the counter 164, is reversed on a pseudo-random basis each time the parity of the four least significant bits of the counter 164 changes, as detected by the EXCLUSIVE-OR gates 584 to 586.

More specifically, the bistable circuit 546, the divider circuit 574, and the bistable circuits 576 co-operate to frequency divide the clock signal CL1 to produce at the Q output of the bistable circuit 576 a 16 Hz signal. This 16 Hz signal is applied to the bistable circuits 578 and 580, the former producing two antiphase versions of the 8 Hz square wave reference signal mentioned earlier and the latter producing at its Q output either a 16 Hz signal or an 8 Hz signal, in dependence upon the output of the NAND gate 581. The output of the NAND gate 581 depends in turn on the output of the EXCLUSIVE-OR gate 584. Each transition from 16 Hz to 8 Hz and vice versa is synchronised with the 8 Hz signal of the bistable circuit 578. The signal at the Q output of the bistable circuit 580 is frequency divided by two by the bistable circuit 582 to produce the two anti-phase chopper control signals at its Q and $\bar{Q}$ outputs. It will be appreciated that aforementioned transitions between 16 Hz and 8 Hz at the clock input of the bistable circuit 582 result in phase reversals between the signals at its Q and $\bar{Q}$ outputs.

In order to reduce the maximum possible change in the count in the counter 164 during a continuous period of up-or-down counting, a fixed frequency of 4096 Hz is subtracted from the frequency of the pulses produced by the voltage-to-frequency converter 162. This is achieved by means of the AND gate 544 and the EXCLUSIVE-OR gate 542.

The former co-operates with the bistable circuit 546 to produce a 4096 Hz pulse train of which the pulses are coincident with the CL1 clock pulses, as are the possible pulses produced by the converter 162. The gate 542 operates to:

(a) produce an output pulse if the converter 162 produces a pulse in the interval between two consecutive pulses of the 4096 Hz pulse train;

(b) produce no output pulse if the converter 162 produces a pulse which is simultaneous with a pulse of the 4096 Hz pulse train; and (c) produce an output pulse in response to each pulse of the 4096 Hz pulse train which is not coincident with an output pulse from the converter 162.

The EXCLUSIVE-OR gate 588 ensures that pulses produced in accordance with (a) are counted upwardly in the counter 164, while pulses produced in accordance with (c) are counted downwardly. Thus with zero power being supplied via the wires L and N, the count in the counter 164 alternately increases and decreases by one bit.

As already indicated, the decoder 212 produces an output signal when the count in the counter 164 increases to two hundred and forty, which output signal is operative via the bistable circuit 214 to increment the count in the counter 556. The counter 556 in turn produces respective output signals at its outputs 560, 558 for each second and sixteenth output signal from the decoder 212. The former of the signals produced by the counter 556 has a maximum frequency of about 10 Hz, and is operative via the amplifier 562 and the auxiliary output 512 of the circuit 124, to energise the light-emitting diode 508 (FIG. 6), so as to provide a visual indication that power is being supplied via the wires L and N and is also being measured by the meter 10g. The latter of the signals from the counter 556 is operative via the bistable circuits 564, 566, 568, the AND gate 570 and the amplifier 572, to produce at the output 150 of the circuit 124g output pulses of 62.5 milliseconds duration synchronised with the 8 Hz square wave reference signal produced at the $\bar{Q}$ output of the bistable circuit 578, which output pulses increment the count of the totalising counter 516 of FIG. 6.

The circuit 124g can readily be made bi-directional, that is capable of measuring power being supplied in either direction via a pair of wires such as the wires L and N. As already mentioned, the counter 164 counts downwardly when the direction in which the power is being supplied reverses. It can therefore easily be arranged that if the decoder 212 produces two successive signals at its output 552 in less than a predetermined time interval, indicating reverse power much greater than the apparent reverse power due to the small offset produced by the resistors R60, R62, a switching logic circuit connects the $\bar{Q}$ output of the bistable circuit 582 to the gate 588 in the place of the Q output, thereby reversing the phase of the signal at the up/down control input 204 of the counter 164.

Figure 8:
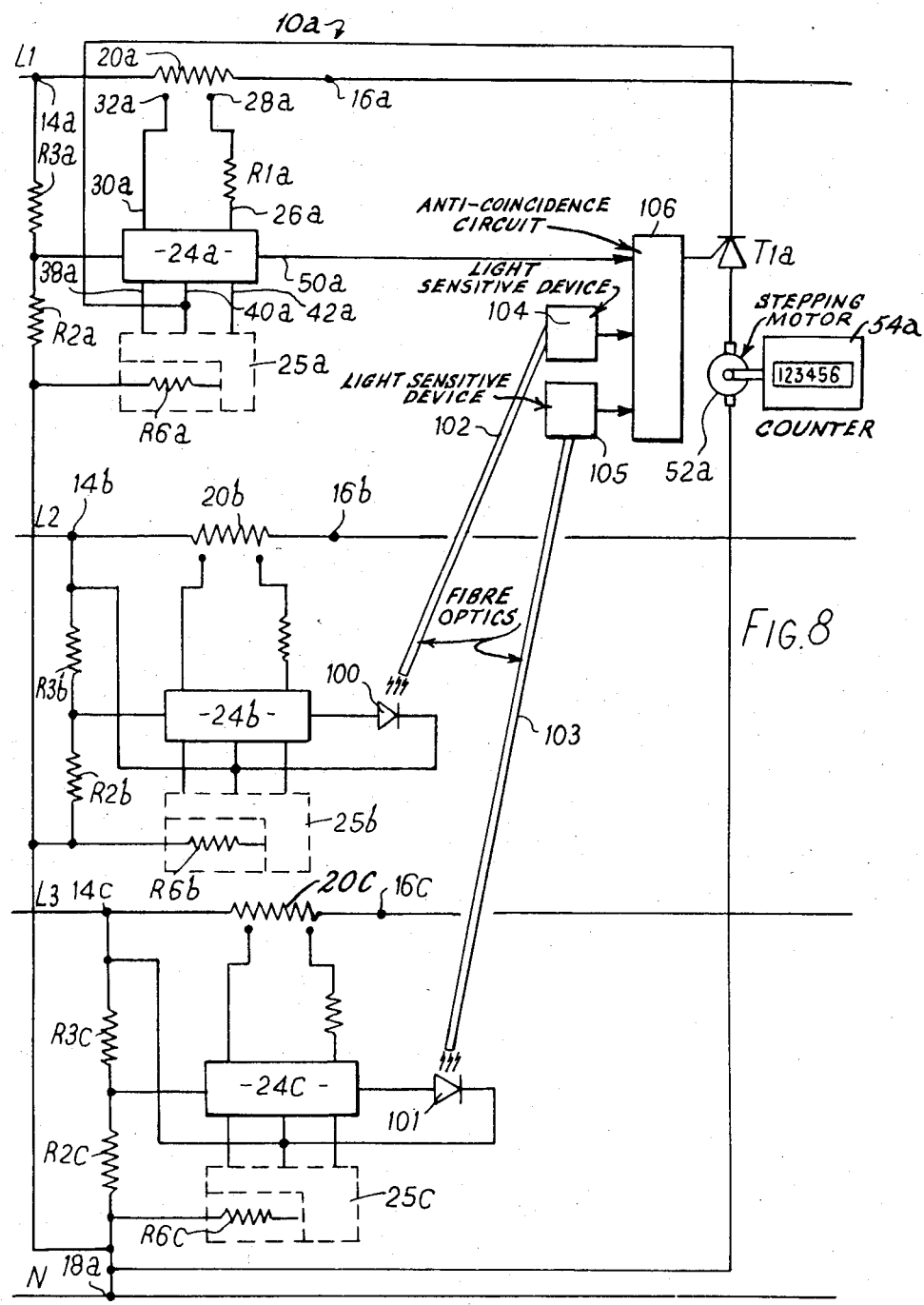
FIG. 8 is a block circuit diagram of the electronic circuitry of another electronic watthour meter in accordance with the present invention, for connection in an electrical power distribution circuit of more than two wires.

The electronic watthour meter of FIG. 8 is indicated generally at 10a, and is shown connected in a three-phase electrical power distribution circuit consisting of three live wires L1 to L3, one for each phase, and a neutral or reference wire N: as earlier, the power supplier and consumer are assumed to be to the left and right respectively of the meter 10a, as viewed in FIG. 8. elements of the meter 10a corresponding to elements of the meter 20 of FIGS. 1 and 2 are given the same references as were used in FIGS. 1 and 2, but with appropriate suffices such as a, b or c.

The meter 10a comprises a housing (not shown) which is of similar construction to the housing 12 and which contains three pairs of terminals 14a and 16a, 14b and 16b and 14c and 16c, each pair being series connected in a respective one of the wires L1 to L3, and a further terminal 18a connected to the wire N. Three current shunts 20a, 20b and 20c, all substantially identical to the shunt 20, are series connected between the terminals of respective ones of the pairs, e.g. the shunt 20a is connected between the terminals 14a and 16a, and three electronic circuits 24a, 24b, 24c, substantially identical to the circuit 24, are associated with respective ones of these shunts in a manner exactly analogous to that described in relation to FIGS. 1 and 2 for the shunt 20 and the circuit 24. Respective voltage dividers, each comprising a pair of resistors such as R2a and R3a, are connected between the terminal 18a and respective ones of the terminals 14a, 14b, 14c, the junction of each voltage divider being connected to the appropriate input of its respective one of the circuits 24a, 24b, 24c. Each of the resistors R2a, R2b, R2c has a relatively high value, typically at least 100 times that of the corresponding resistor R3a, R3b or R3c. Each of the circuits 24a, 24b 24c has a respective power supply 25a, 25b or 25c substantially identical to the power supply of the circuit 24, the respective relatively high value resistors R6a, R6b, and R6c of these power supplies all being connected to the terminal 18a.

The meter 10a also comprises a thyristor T1a, a stepping motor 52a and a totalising counter 54a substantially identical to those of FIG. 1 The thyristor T1a and stepping motor 52a can be effectively series connected between the wire N and any one of the wires L1 to L3, with the anode of the thyristor being effectively connected to that one of the wires: by way of example they are shown connected between the wires N and L1, with the anode of the thyristor connected to the wire L1 at the terminal 14a.

The respective overflow outputs of the reversible counters within the circuits 24b, 24c are connected to respective light sources 100 and 101, which typically comprise light-emitting diodes (although it should be noted that the term "light" is to be understood herein to include infra-red radiation). The light sources 100 and 101 are optically coupled by respective fibre optics 102 and 103 to respective lightsensitive devices 104, 105, whose respective outputs are connected to two inputs of a three-input anti-coincidence circuit 106. The third input of the circuit 106 is connected to the overflow output of the reversible counter in the circuit 24a, while the output of the circuit 106 is connected to the gate of the thyrister T1a. The light sources 100 and 101 derive the power supply or supplies necessary for their operation from the respective power supplies of the circuits 24b and 24c respectively, while the devices 104, 105 and the circuit 106 derive their power supply or supplies from the power supply of the circuit 24a.

In operation, each of the circuits 24a, 24b, 24c operates in a manner exactly analogous to that described with reference to FIGS. 1 and 2, to produce at the overflow output of its respective reversible counter a pulse train whose pulse rate is related as also described hereinbefore to the product of the voltage between the respective one of the wires L1, L2, L3 and the wire N and the current flowing in that one of the wires. The respective pulse trains from the circuits 24a, 24b, 24c are transmitted to the anti-coincidence circuit 106, that from the circuit 24a being transmitted directly and those from the circuits 24b and 24c being transmitted via the isolating optical couplings based on the fibre optics 102 and 103 respectively. The circuit 106 interleaves the individual pulses of the three pulse trains, to ensure that all the pulses are counted by the totalising counter 54a. The totalising counter 54a thus indicates the total amount of electrical energy supplied to the consumer by means of the four wires L1, L2, L3 and N.

Since each of the circuits 24a, 24b and 24c is connected to and "floats" electrically on its respective one of the wires L1, L2 and L3, it is protected from voltage transients in a manner exactly analogous to that already described in relation to the circuit 24 of FIGS. 1 and 2. The use of the optical couplings based on the fibre optics 102 and 103 ensures that the respective pulse trains produced by the circuits 24a, 24b and 24c can be combined for counting without significantly reducing the high degree of electrical isolation between these circuits; it also enables the circuits to be physically separated from each other within the housing 12a, thus reducing possible interactions, e.g. of magnetic fields, and results in a relatively simple mechanical assembly.

In a more general case of an electrical power distribution circuit of N wires, where N>2, the basic requirements of the meter are (N−1) pairs of current terminals associated with (N−1) of the wires, (N−1) current shunts each connected between the current terminals of a respective pair, a further terminal connected to the Nth wire, (N−1) resistive potential dividers each connected between the further terminal and a selected current terminal of a respective pair, (N−1) circuits similar to the circuit 24, and (N−2) isolating couplings for coupling (N−2) of the circuits to the common output stage of thyristor, stepping motor and totalising counter.

Several modifications can be made to the meter 10a of FIG. 8. For example, the possible modifications of the circuit 24 of FIGS. 1 and 2 can also be effected in the circuits 24a, 24b and 24c of FIG. 8. Additionally, each of the circuits 24a, 24b, 24c could, if desired, derive its power supply between its respective one of the wires L1, L2 and L3 and any other wire, while the thyristor T1a and the stepping motor 52a can be effectively series connected between any pair of the wires L1, L2, L3 and N: however, if the anode of the thyristor is connected to the wire N, another optical coupling must be provided. Further, the stepping motor 52a and the thyristor T1a can be modified or replaced as described in relation to the meter 10 of FIGS. 1 and 2. Finally, the circuits 24a, 24b, 24c can be replaced by circuits identical to the circuit 124, 124g of FIGS. 3 and 7 respectively, while the power supplies of the circuits 24a, 24b, 24c can be replaced by power supplies identical to that shown in FIG. 5.

The electronic watthour meter of FIG. 9 is indicated generally at 10b, and is shown connected in a two-phase electrical power distribution circuit consisting of two live wires L1 and L2 and a neutral wire N. The respective alternating voltages of the wires L1 and L2 with respect to the wire N are substantially equal in magnitude, typically 110 volts, and there is a 180° phase difference between them. Again, the power supplier and consumer are assumed to be to the left and right respectively of the meter 10b as viewed in FIG. 9. Additionally, elements similar to those of earlier figures have again been given similar references, but with appropriate suffices.

The meter 10b comprises a housing (not shown) which is of similar construction to the housing 12 of FIG. 1 and which contains two pairs of terminals 14d and 16d, 14e and 16e, each pair being series connected in a respective one of the wires L1 and L2. Two current shunts, 20d and 20e, both substantially identical to the shunt 20, are series connected between the respective pair of terminals 14d, 16d and 14e, 16e. The meter 10b also includes an electronic circuit 124a substantially identical to the circuit 124 of FIG. 3: in particular, the circuit 124a has inputs and an output having the same references as were used in relation to FIG. 3, but with the suffix a.

An isolating voltage transformer 300, having a primary winding 302 and a secondary winding 304 with a 1:1 turns ratio, has its primary winding 302 connected between the points 28e and 32e of the shunt 20e. The secondary winding 304 has one end connected to the point 28d of the shunt 20d and its other end connected to the input 126a of the circuit 124a. The point 32d of the shunt 20d is connected to the input 130a of the circuit 124a.

The power supply inputs 138a, 140a and 142a of the circuit 124a are connected to a power supply 306 identical to that shown in FIG. 5, the resistor R40 and the zero volt power supply rail of this power supply 306 being connected to the terminals 14e and 14d respectively.

The input 134a of the circuit 124a is connected via a high value resistor R2d to the terminal 18 within the power supply 306, while the output 150a of the circuit 124a is connected to a thyristor, stepping motor and totalising counter (not shown) arranged substantially as described in relation to FIG. 1.

In operation, the current shunt 20d produces between the points 28d and 32d thereof a voltage $V_{y1}$ whose instantaneous magnitude is proportional to the current $I_1$ flowing in the wire L1, while the current shunt 20e produces a voltage $V_{y2}$ similarly related to the current flowing in the wire L2. An isolated copy of the voltage $V_{y2}$ is produced across the secondary winding 304 of the transformer 300 and summed with the voltage $V_{y1}$ to produce a voltage $V_{sum}$ proportional to the sum of the currents $I_1$ and $I_2$ between the inputs 126a and 130a of the circuit 124a. The secondary winding 304 of the transformer 300 is connected so that the polarity of this isolated copy of the voltage $V_{y2}$ has the same polarity as the voltage $V_{y1}$, so that the voltage $V_{sum}$ is proportional to the sum of the absolute magnitudes or moduli, of the currents $I_1$ and $I_2$.

The resistor R2d passes a current $I_x$ proportional to the sum of the respective voltages $V_1$ and $V_2$ of the wires L1 and L2 with respect to the wire N.

The circuit 124a operates, in a manner exactly analogous to that described in relation to the circuit 124 of FIG. 3, to produce an output representative of the time integral of the product of the signals V sum and $I_x$, which product is proportional to $(V_1+V_2)(I_1+I_2)$. However, since the voltages $V_1$ and $V_2$ are equal and have an 180° phase difference, $V_1+V_2=2\ V_1=2V_2$, thus the product $(V_1+V_2)(I_1+I_2)$i also proportional to the power, $V_1I_1+V_2I_2$, supplied to the consumer via the wires L1, L2 and N, since $V_1I_1+V_2I_2=V_1(I_1+I_2)=V_2(I_1+I_2)$. The meter 10b therefore produces an indication of the total amount of electrical energy supplied to the consumer via the wires L1, L2 and N.

The aforementioned high transient voltages, which may occur between the wires L1 and L2, do not have the same effect on the isolating voltage transformer 300 as they do on the isolating current transformers of the prior art. This is because the generation of dangerously high voltages across the secondary winding 304 of the transformer 300 is substantially prevented by the fact that this secondary winding is effectively short-circuited by the very low resistance constituted by the shunt 20e connected across its primary winding 302.

It will be noted that no connection between the meter 10b and the neutral wire N is necessary. However, if desired, either the resistor R2d alone, or the resistor R40, can be connected to a terminal connected to the wire N, so that $I_x$ is proportional to $V_1$ rather than the sum of $V_1$ and $V_2$.

Several other modifications can be made to the meter 10b of FIG. 9. For example, the circuit 124a can be replaced by a circuit similar to the circuit 24 of FIGS. 1 and 2 or the circuit 124g of FIG. 7, while the power supply can be replaced by one similar to that of FIG. 1. Additionally, the thyristor, stepping motor and totalising counter can again be modified or replaced as described in relation to the meter 10 of FIGS. 1 and 2.

The electronic watthour meter of FIG. 10 is indicated generally at 10c, and is shown connected in an electrical power distribution circuit consisting of a live wire L and a neutral or reference wire N (e.g. the distribution circuit of FIG. 1). Again, the electrical power supplier and consumer are assumed to be to the left and right respectively of the meter, as viewed in FIG. 10 and elements corresponding to elements of earlier figures have been given corresponding references with appropriate suffices.

The meter 10c comprises a housing (not shown) of similar construction to the housing 12 of FIG. 1, the housing containing a pair of current terminals 14f and 16f series connected in the live wire L and a terminal 118f connected to the neutral wire N. A shunt 20f, substantially identical to the shunt 20 of FIG. 1, is series connected between the terminals 14f, 16f, the points 28f and 32f of this shunt being connected to the inputs 126b and 130b respectively of a circuit 124b substantially identical to the circuit 124 of FIG. 3. The power supply inputs 138b, 140b and 142b of the circuit 124b are connected to a power supply 400 identical to that of FIG. 5, while the input 134b of the circuit 124b is connected to the terminal 18 within the power supply 400 via a high value resistor R2f.

The output 150b of the circuit 124b is selectively connectable by means of a change-over switch 402, to either of two similar registers 404, 406, which are implemented using magnetic bubble memory or MNOS storage techniques. Thus the output pulses appearing at the output 150b increment the contents of either the register 404 or the register 406, in dependence upon the position of the switch 402.

Each of the registers 404, 406 is connected to a respective multi-digit display of the seven segment LED or LCD type (not shown), which is arranged to display the contents of its respective register either continuously or briefly in response to the operation of a button or switch (not shown) accessible from the exterior of the housing of the meter 10c. However, if desired, a single display can be provided, successive operations of the aforementioned button or switch being arranged to cause this display to display the respective contents of the registers 404, 406 sequentially. The registers 404, 406 and their associated display or displays derive their required power supply voltages from the power supply 400, the connections for achieving this having been omitted from FIG. 10 for the sake of simplicity.

The switch 402 forms part of a remotely-controllable relay 408 of the kind which operates in response to coded control signals superimposed upon the normal alternating power voltage between the wires L and N, such relays being referred to in the art as ripple control relays. The relay 408 is also contained within the housing of the meter 10c, and is substantially identical (except as specified hereinafter) to the relay described and claimed in our U.S. Pat. No. 4,232,298 entitled "Remotely Controllable Relays." Thus the relay 408 comprises circuitry 410 identical to that described in the aforementioned U.S. patent, except that:

(a) the DC power supply is omitted, and the power supply 400 is used in place thereof, the circuitry 410 having power supply inputs 414 and 416 connected to the power supply 400; and (b) the 32768 Hz oscillator (reference 56 of FIG. 5 of the aforementioned U.S. patent is omitted, and a substantially identical oscillator, which forms part of the aforementioned clock pulse generator of the circuit 124b, is used in place thereof:

this oscillator is indicated at 412 in FIG. 10, and has an output which is connected to an input 418 of the relay circuitry 410 (as well as to the circuit 124b). It will be appreciated that at least the crystal of the oscillator 412 is in any case external to the integrated circuit portion of the circuit 124b, so that practically no modification of the circuit 124b is necessitated by the inclusion of the relay 408 in the meter 10c.

The circuit 124b and the relay circuitry 410 thus have a common housing, a common power supply and a common timing oscillator, which represents a significant cost saving.

The relay circuitry 410 has an input 420 connected via a relatively high value resistor R50 to the terminal 18 within the power supply 400, for receiving the aforementioned coded control signals, and two outputs 422, 424 connected to the respective gates of two thyristors T10, T11. The respective anodes of the thyristors T10 and T11 are connected via respective current-limiting resistors R51, R52 to the terminal 18 within the power supply 400, are also connected to each other via a relay coil 426 which controls the position of the switch 402. The respective cathodes of the thyristors T10 and T11 are connected to the zero volt power supply rail of the power supply 400.

In operation, the circuit 124b operates in a manner exactly analogous to that described earlier in relation to FIG. 3, and, assuming the switch 402 to be in the position illustrated in FIG. 8, the contents of the register 404 represent the total amount of electrical energy supplied via the wires L and N to the consumer. However, if it is desired to differentiate, for example, between electrical energy consumed at peak hours and electrical energy consumed at off-peak hours, e.g. so that the consumer can be billed at different rates for the electrical energy consumed at these different times, then appropriate coded control signals are transmitted over the wires L and N to operate the switch 402 of the relay 408 at the appropriate times, the way in which the relay 408 operates in response to these coded signals being described in detail in the aforementioned U.S. patent. Thus if the registers 404, 406 are used to record electrical energy consumption at peak hours and off-peak hours respectively, and peak hours are defined, for example, as 0600 hours to 1800 hours, then a coded signal operative to change the position of the switch 402 from its illustrated position is transmitted each day at 1800 hours, and a different coded signal, operative to restore the switch 402 to the illustrated position, is transmitted each day at 0600 hours. Obviously, these times are exemplary only, and can be changed at will. In this case, the sum of the respective contents of the registers 404, 406 represents the total amount of electrical energy supplied via the wires L and N to the consumer.

The relay 408 has been simplified for the purpose of clarity in relation to the relay of the aforementioned U.K. patent application. Thus, in addition to the modifications relating to the power supply and oscillator already mentioned, the relay 408, in practice, incorporates two ON-OFF switches rather than the changeover switch 402, each of these ON-OFF switches being controlled by a respective coil and pair of thyristors arranged as shown in FIG. 10. Also, a further stage of surge protection circuitry (resistor 404 and varistor 405 of FIG. 4 of the aforementioned U.S. patent) is normally included.

Several modifications can be made by the relay 10c of FIG. 10. For example, any convenient form of ripple control relay can be used in place of the relay 408. Additionally, the power supply 400 can be replaced by a power supply of the kind shown in FIG. 1, while the circuit 124b can be replaced by a circuit similar to the circuit 24 of FIGS. 1 and 2 or the circuit 124g of FIG. 7. Moreover, the registers 404 and 406 and their associated display or displays can be replaced by a suitable stepping motor and totalising counter configuration of the kind described in relation to FIG. 1.

Although the various embodiments of electronic devices in accordance with the present invention have been described herein principally with reference to their use in electronic watthour meters, their use is not restricted to such applications. Thus electronic devices in accordance with the invention may also form the basis of overload protection circuits, of the kind described in relation to FIG. 3c, for connection in electrical power distribution circuits, or of other kinds of meters, e.g. demand meters, for connection in such distribution circuits: in the demand meter context, it will be appreciated that the circuit of FIG. 3c can be readily adapted to produce an indication whether the average power demand over a predetermined time interval has exceeded a given level.

What is claimed is:

1. An electronic circuit for producing an output signal representative of the time integral of the product of two input signals, the circuit comprising:

a multiplier for receiving and multiplying together the two input signals to produce a signal dependent upon the product of the two input signals;

a signal-to-frequency converter arranged to convert the product-dependent signal to a pulse signal whose pulse rate is dependent upon the magnitude of the product-dependent signal;

a reversible counter connected to receive and count the pulses of the pulse signal so as to produce said output signal; and means for repetitively and simultaneously reversing the effective polarity of one of the input signals and the direction of counting of the reversible counter, whereby to substantially reduce errors in said output signal due to drift in the multiplier;

wherein the reversible counter includes means responsive to a first predetermined count therein to reset the counter to a second predetermined count, the difference between said first and second predetermined counts being less than the full house count of the counter.

2. A circuit as claimed in claim 1, wherein the multiplier comprises a variable-transconductance multiplier.

3. A circuit as claimed in claim 2, wherein said variable-transconductance multiplier comprises an emitter-coupled pair of transistors arranged to receive the first signal as a voltage between the respective bases of the transistors and the second signal in a form which varies the respective emitter currents of the transistors, whereby to produce said product-dependent signal between the respective collectors of the transistors.

4. A circuit as claimed in claim 3, wherein said variable-transconductance multiplier further comprises a second emitter-coupled pair of transistors, also arranged to receive the first signal as a voltage between the respective bases of the transistors, the collectors of the transistors of the second pair being cross-coupled with the collectors of the transistors of the first mentioned pair, whereby to substantially reduce an undesired common-mode component which may be present in said product-dependent signal.

5. A circuit as claimed in claim 3, wherein the reversing means is arranged to reverse the effective polarity of said second signal.

6. A circuit as claimed in claim 1, wherein the reversible counter is of the presettable type, and wherein said means responsive to said first predetermined count therein is responsive thereto to produce an output pulse which resets the counter to a preset count, said preset count being greater than zero and said predetermined count being greater than said preset count but less than the full house count of the counter, said output pulses constituting said output signal.

7. A circuit as claimed in claim 2, further comprising means for increasing the gain of the signal-to-frequency converter at higher rates of increase of said output signal so as to compensate for non-linearity in the characteristic of the variable-transconductance multiplier at said higher rates.

8. A circuit as claimed in claim 1, wherein the reversing means operates such that the average duration of the periods for which said reversing takes place is substantially equal to the average duration of the periods for which said reversing does not take place.

9. A circuit as claimed in claim 8, wherein the reversing means includes control means for generating at least one square wave signal for controlling said polarity and counting direction reversals, and means for repetitively changing the phase of said at least one square wave signal by 180° on a substantially random basis.

10. A circuit as claimed in claim 9, wherein the reversible counter is a binary counter, and said phase changing means comprises means for sensing the parity of a selected number of the least significant bits in said counter and for effecting said phase changes in response to changes in the sensed parity.

11. An electronic circuit for producing an output signal representative of the time integral of the product of two input signals, the circuit comprising:
a multiplier for receiving and multiplying together the two input signals to produce a signal dependent upon the product of the two input signals;
a signal-to-frequency converter arranged to convert the product-dependent signal to a pulse signal whose pulse rate is dependent upon the magnitude of the product-dependent signal;
a reversible counter connected to receive and count the pulses of the pulse signal so as to produce said output signal; and
means for repetitively and simultaneously reversing the effective polarity of one of the input signals and direction of counting of the reversible counter, whereby to substantially reduce errors in said output signal due to drift in the multiplier;
wherein the signal-to-frequency converter comprises a source of an offset signal whose magnitude is selected such that the sum of the offset signal and the product-dependent signal is monopolar, the converter being connected to receive and convert the sum of the offset signal and the product-dependent signal to produce said pulse signal.

12. A circuit as claimed in claim 11, wherein the signal-to-frequency converter comprises an integrator connected to receive and integrate the sum of the offset signal and the product-dependent signal, whereby the output of the integrator ramps towards a predetermined level, a detector responsive to the output of the integrator to produce a control signal when the output of the integrator reaches said predetermined level, and a reference source responsive to said control signal to combine a reference signal of determined magnitude and duration with the sum of the offset signal and the product-dependent signal, in opposition thereto, whereby the output of the integrator ramps back through said predetermined level.

13. A circuit as claimed in claim 12, wherein the multiplier comprises a variable-transconductance multiplier including an emitter-coupled pair of transistors arranged to receive the first signal as a voltage between the respective bases of the transistors and the second signal in a form which varies the respective emitter currents of the transistors, whereby to produce said product-dependent signal between the respective collectors of the transistors, and wherein the offset signal source and the reference signal source together include a further emitter-coupled pair of transistors, the respective collectors of said further pair being connected to respective ones of the collectors of the first mentioned pair of transistors, the respective emitters of said further pair being resistively coupled to a reference voltage source, the base of one transistor of the first pair being biassed from an offset voltage source.

14. A circuit as claimed in claim 13, wherein the integrator comprises a differential amplifier having a capacitance negative-feedback connected between its output and its inverting input, the inverting and non-inverting inputs of the amplifier being connected to respective ones of the collectors of the transistors of the firstmentioned pair.

15. A circuit as claimed in claim 12, wherein the signal-to-frequency converter includes a clock pulse generator arranged to produce clock pulses at a predetermined frequency and gating means connected to receive said clock pulses and said control signal in such a manner that said reference signal is applied to the integrator during time intervals whose duration is equal to and substantially coincident with respective clock pulse periods.

16. A circuit as claimed in claim 12, wherein the multiplier comprises a variable-transconductance multiplier and further comprising means for increasing the gain of the signal-to-frequency converter at higher rates of increase of said output signal so as to compensate for non-linearity in the characteristic of the variable-transconductance multiplier at said higher rates, and wherein said gain-increasing means comprises means for reducing the effective magnitude of the reference signal.

17. An electronic circuit for producing an output signal representative of the time integral of the product of two input signals, the circuit comprising:
- a multiplier for receiving and multiplying together the two input signals to produce a signal dependent upon the product of the two input signals;
- a signal-to-frequency converter arranged to convert the product-dependent signal to a pulse signal whose pulse rate is dependent upon the magnitude of the product-dependent signal;
- a reversible counter connected to receive and count the pulses of the pulse signal so as to produce said output signal; and
- means for repetitively and simultaneously reversing the effective polarity of one of the input signals and direction of counting of the reversible counter, whereby to substantially reduce errors in said output signal due to drift in the multiplier;
- wherein the multiplier comprises a variable transconductance multiplier, and further comprising means for increasing the gain of the signal-to-frequency converter at higher rates of increase of said output signal so as to compensate for non-linearity in the characteristic of the variable-transconductance multiplier at said higher rates.

18. An eletronic circuit for producing an output signal representative of the time integral of the product of two input signals, the circuit comprising:
- a multiplier for receiving and multiplying together the two input signals to produce a signal dependent upon the product of the two input signals;
- a signal-to-frequency converter arranged to convert the product-dependent signal to a pulse signal whose pulse rate is dependent upon the magnitude of the product-dependent signal;
- a reversible counter connected to receive and count the pulses of the pulse signal so as to produce said output signal; and
- means for repetitively and simultaneously reversing the effective polarity of one of the input signals and direction of counting of the reversible counter, whereby to substantially reduce errors in said output signal due to drift in the multiplier;
- wherein the reversing means includes control means for generating at least one square wave signal for controlling said polarity and counting direction reversals, and means for repetitively changing the phase of said at least one square wave signal by 180° on a substantially random basis, such that the average duration of the periods for which said reversing takes place is substantially equal to the average duration of the periods for which said reversing does not take place.

19. A circuit as claimed in claim 18, wherein the reversible counter is a binary counter, and said phase changing means comprises means for sensing the parity of a selected number of the least significant bits in said counter and for effecting said phase changes in response to changes in the sensed parity.

* * * * *